United States Patent
Ma et al.

(10) Patent No.: US 12,004,387 B2
(45) Date of Patent: Jun. 4, 2024

(54) DISPLAY SUBSTRATE AND MANUFACTURING METHOD THEREOF, AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Hongwei Ma, Beijing (CN); Xiangdan Dong, Beijing (CN); Rui Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 931 days.

(21) Appl. No.: 16/975,521

(22) PCT Filed: Oct. 29, 2019

(86) PCT No.: PCT/CN2019/114061
§ 371 (c)(1),
(2) Date: Aug. 25, 2020

(87) PCT Pub. No.: WO2021/081765
PCT Pub. Date: May 6, 2021

(65) Prior Publication Data
US 2022/0384555 A1 Dec. 1, 2022

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
None
See application file for complete search history.

(56) References Cited

U.S. PATENT DOCUMENTS

| 10,673,017 B2 | 6/2020 | Hirase et al. |
| 10,741,625 B2 | 8/2020 | Kang et al. |

(Continued)

FOREIGN PATENT DOCUMENTS

| CN | 107026177 A | 8/2017 |
| CN | 107329336 A | 11/2017 |

(Continued)

OTHER PUBLICATIONS

International Search Report of PCT/CN2019/114061 in Chinese, dated Jul. 24, 2020.

(Continued)

*Primary Examiner* — Xiaoming Liu
(74) *Attorney, Agent, or Firm* — Collard & Roe, P.C.

(57) ABSTRACT

A display substrate and a manufacturing method thereof, and a display device are disclosed. The display substrate includes a base substrate, lead wires, a plurality of contact pads, a first insulation laminated layer, and a second insulation laminated layer. The base substrate includes a display region, a dam region at least partially surrounding the display region, a transition region on a side of the dam region away from the display region, and a first bonding region and a bonding peripheral region on a side of the transition region away from the dam region. The plurality of contact pads is in the first bonding region and configured to be electrically connected to the lead wires. The first insulation laminated layer is in the first bonding region. The second insulation laminated layer is in the bonding peripheral region.

18 Claims, 10 Drawing Sheets

(56) References Cited

U.S. PATENT DOCUMENTS

| | | | |
|---|---|---|---|
| 10,923,553 | B2 | 2/2021 | Mitani |
| 2016/0064691 | A1 | 3/2016 | Lee et al. |
| 2018/0124933 | A1 | 5/2018 | Park et al. |
| 2018/0284507 | A1 | 10/2018 | Xu et al. |
| 2018/0343753 | A1 | 11/2018 | Kim et al. |
| 2019/0319201 | A1 | 10/2019 | Goh et al. |
| 2020/0212155 | A1* | 7/2020 | Mitani ................. H10K 77/111 |

FOREIGN PATENT DOCUMENTS

| | | | |
|---|---|---|---|
| CN | 107819014 | A | 3/2018 |
| CN | 108598135 | A | 9/2018 |
| CN | 109388287 | A | 2/2019 |
| KR | 20190108220 | A | 9/2019 |
| WO | 2018/173177 | A1 | 9/2018 |
| WO | 2019/064342 | A1 | 4/2019 |

OTHER PUBLICATIONS

Notice of Transmittal of the International Search Report of PCT/CN2019/114061 in Chinese, dated Jul. 24, 2020.
Written Opinion of the International Searching Authority of PCT/CN2019/114061 in Chinese, dated Jul. 24, 2020.
Extended European Search Report in European Patent Application No. 19945410.9 dated Oct. 12, 2022.

* cited by examiner

DISPLAY SUBSTRATE AND MANUFACTURING METHOD THEREOF, AND DISPLAY DEVICE

CROSS REFERENCE TO RELATED APPLICATIONS

This application is the National Stage of PCT/CN2019/114061 filed on Oct. 29, 2019, the disclosure of which is incorporated by reference.

TECHNICAL FIELD

Embodiments of the present disclosure relate to a display substrate and a manufacturing method thereof, and a display device.

BACKGROUND

With the development of organic light-emitting diode (OLED) display devices, especially the development of touch OLED display devices, consumers have higher requirements for display and touch experience. In order to meet the increasing demand of consumers for the thickness of the display devices and the touch experience of the display devices, the frame of the display devices is gradually reduced, the screen ratio of the display devices is gradually increased, and the thickness of the display devices is gradually reduced.

SUMMARY

At least one Embodiment of the present disclosure provide a display substrate, which includes a base substrate, lead wires, a plurality of contact pads, a first insulation laminated layer, and a second insulation laminated layer. The base substrate includes a display region, a dam region at least partially surrounding the display region, a transition region on a side of the dam region away from the display region, a first bonding region on a side of the transition region away from the dam region, and a bonding peripheral region on the side of the transition region away from the dam region, the bonding peripheral region located between the first bonding region and the transition region; the lead wires in the first bonding region; the plurality of contact pads, in the first bonding region and configured to be electrically connected to the lead wires, respectively; the first insulation laminated layer, in the first bonding region; and the second insulation laminated layer, located in the bonding peripheral region. At least two insulation layers of the second insulation laminated layer extend into the first bonding region to obtain the first insulation laminated layer, and a thickness of the first insulation laminated layer along a direction perpendicular to the base substrate is smaller than a thickness of the second insulation laminated layer along the direction perpendicular to the base substrate.

For example, in the display substrate provided by at least one embodiment of the present disclosure, the plurality of contact pads include a plurality of first contact pads and a plurality of second contact pads, the plurality of first contact pads are arranged in at least one row, and each of the plurality of first contact pads and each of the plurality of second contact pads include a conductive pattern lamination layer.

For example, the display substrate provided by at least one embodiment of the present disclosure, further includes a third insulation laminated layer, in the transition region, wherein the third insulation laminated layer includes a first insulation laminated sub-layer and a second insulation laminated sub-layer, an orthographic projection of the first insulation laminated sub-layer on the base substrate at least partially covers the transition region and the bonding peripheral region, and an orthographic projection of the second insulation laminated sub-layer on the base substrate at least partially covers the transition region and the bonding peripheral region.

For example, in the display substrate provided by at least one embodiment of the present disclosure, the third insulation laminated layer further includes a third insulation laminated sub-layer that is between the first insulation laminated sub-layer and the second insulation laminated sub-layer, and an orthographic projection of the third insulation laminated sub-layer on the base substrate does not overlap with the first bonding region and the bonding peripheral region.

For example, in the display substrate provided by at least one embodiment of the present disclosure, the at least two insulation layers include a first insulation layer and a second insulation layer, wherein the first insulation layer is on the base substrate and the second insulation layer is on a side of the first insulation layer away from the base substrate, and the first insulation laminated sub-layer extends to the bonding peripheral region to obtain the first insulation layer, and the second insulation laminated sub-layer extends to the bonding peripheral region to obtain the second insulation layer.

For example, the display substrate provided by at least one embodiment of the present disclosure further includes a pixel structure, in the display region. The pixel structure includes a pixel drive circuit, a first planarization layer, a first transfer electrode, a second planarization layer, and a light-emitting element, the pixel drive circuit includes a thin film transistor, the thin film transistor includes a gate electrode, a source electrode, a drain electrode, and an interlayer insulation layer, and the interlayer insulation layer is on a side of the gate electrode away from the base substrate and on a side of the source electrode and the drain electrode close to the base substrate, the first planarization layer is on a side of the pixel drive circuit away from the base substrate to provide a first planarization surface and includes a first via hole, the first transfer electrode is on the first planarization surface and is electrically connected to one of the source electrode and the drain electrode of the thin film transistor through the first via hole, the second planarization layer is on a side of the first transfer electrode away from the base substrate to provide a second planarization surface and includes a second via hole, and the light-emitting element is on the second planarization surface and is electrically connected to the first transfer electrode through the second via hole, the interlayer insulation layer is provided at a same layer as the first insulation layer, the second planarization layer is provided at a same layer as the second insulation layer, and the first planarization layer is provided at a same layer as the third insulation laminated sub-layer.

For example, in the display substrate provided by at least one embodiment of the present disclosure, a thickness of the second planarization layer along the direction perpendicular to the base substrate is substantially equal to a thickness of the third insulation laminated sub-layer in the transition region along the direction perpendicular to the base substrate and a thickness of the second insulation layer in the bonding peripheral region along the direction perpendicular to the base substrate, respectively.

For example, in the display substrate provided by at least one embodiment of the present disclosure, relative to the base substrate, a height of the second insulation layer in the first bonding region is smaller than a height of the second insulation layer in the bonding peripheral region.

For example, in the display substrate provided by at least one embodiment of the present disclosure, a thickness of the second insulation layer in the bonding peripheral region along the direction perpendicular to the base substrate is substantially equal to a thickness of the second insulation laminated sub-layer in the transition region along the direction perpendicular to the base substrate.

For example, in the display substrate provided by at least one embodiment of the present disclosure, the first insulation layer and the second insulation layer extend into the first bonding region to obtain the first insulation laminated layer.

For example, in the display substrate provided by at least one embodiment of the present disclosure, the at least two insulation layers further include a third insulation layer, and the third insulation layer is on a side of the second insulation layer away from the base substrate and is configured to expose the second insulation layer on a side close to the plurality of contact pads.

For example, in the display substrate provided by at least one embodiment of the present disclosure, the display region includes signal lines configured to being electrically connected to the lead wires.

For example, in the display substrate provided by at least one embodiment of the present disclosure, the conductive pattern lamination layer includes at least two conductive patterns, at least one insulation layer of the first insulation laminated layer covers an edge of one of the at least two conductive patterns and an edge of the at least one insulation layer is covered by the other of the at least two conductive patterns.

For example, in the display substrate provided by at least one embodiment of the present disclosure, the conductive pattern lamination layer includes a first conductive pattern and a second conductive pattern, the first conductive pattern is on a side of the lead wires away from the base substrate and is electrically connected to the lead wires, the second conductive pattern is on a side of the first conductive pattern away from the base substrate and covers an edge of the first conductive pattern, and the second insulation layer of the first insulation laminated layer covers an edge of the second conductive pattern.

For example, in the display substrate provided by at least one embodiment of the present disclosure, the first insulation layer of the first insulation laminated layer is between the first conductive pattern and the lead wires, the first insulation layer between the first conductive pattern and the lead wires has first conductive pattern via holes, and the first conductive pattern is electrically connected to the lead wires through the first conductive pattern via holes.

For example, in the display substrate provided by at least one embodiment of the present disclosure, the pixel structure further includes a first display region metal layer, the first conductive pattern is provided at a same layer as the first display region metal layer, and the second conductive pattern is provided at a same layer as the first transfer electrode.

For example, in the display substrate provided by at least one embodiment of the present disclosure, the source electrode and the drain electrode of the thin film transistor are in the first display region metal layer.

For example, in the display substrate provided by at least one embodiment of the present disclosure, the base substrate further includes a second bonding region, the second bonding region is on a side of the first bonding region away from the display region, and the first insulation layer extends to the second bonding region, the display substrate further includes a plurality of third contact pads and second bonding region lead wires, the plurality of third contact pads are in the second bonding region and provided on a side of the first insulation layer away from the base substrate, and the plurality of third contact pads include a plurality of contact pad metal layers, and the second bonding region lead wires are between the first bonding region and the second bonding region and is configured to connect the plurality of second contact pads and the plurality of third contact pads.

For example, in the display substrate provided by at least one embodiment of the present disclosure, the plurality of contact pad metal layers include a first contact pad metal layer and a second contact pad metal layer, the first contact pad metal layer is on a side of the first insulation layer away from the base substrate, and the second contact pad metal layer is laminated with the first contact pad metal layer and covers a periphery of the second contact pad metal layer, the first contact pad metal layer is at a same layer as the first conductive pattern layer, and the second contact pad metal layer is at a same layer as the second conductive pattern layer.

For example, in the display substrate provided by at least one embodiment of the present disclosure, the second contact pad metal layer extends toward the first bonding region to form the second bonding region lead wires, and the second insulation layer extends to the second bonding region and covers the second bonding region lead wires and an edge of the second contact pad metal layer.

For example, in the display substrate provided by at least one embodiment of the present disclosure, a thickness of a part of the second insulation layer located between the first bonding region and the second bonding region along the direction perpendicular to the base substrate is substantially identical to a thickness of a part of the second insulation layer located in the first bonding region along the direction perpendicular to the base substrate, and an orthographic projection of the part of the second insulation layer between the first bonding region and the second bonding region on the base substrate at least partially overlaps with an orthographic projection of the second bonding region lead wires on the base substrate.

For example, in the display substrate provided by at least one embodiment of the present disclosure, the conductive pattern lamination layer further includes a third conductive pattern, and the third conductive pattern is on a side of the second conductive pattern away from the base substrate, and an edge of the second insulation layer of the first insulation laminated layer is covered by the third conductive pattern.

For example, in the display substrate provided by at least one embodiment of the present disclosure, the plurality of contact pad metal layers further include a third contact pad metal layer, the third contact pad metal layer is on a side of the second contact pad metal layer away from the base substrate and covers an edge of the second insulation layer in the second bonding region, and the third contact pad metal layer is provided at a same layer as the third conductive pattern layer.

For example, the display substrate provided by at least one embodiment of the present disclosure further includes an encapsulation layer, an auxiliary electrode, and a display region protection layer, the encapsulation layer is at least in the display region, and the encapsulation layer includes at least one encapsulation sub-layer, the auxiliary electrode and the display region protection layer are in the display region, the auxiliary electrode is on a side of the encapsulation layer away from the base substrate, and the display region protection layer is on a side of the auxiliary electrode away from the base substrate, and the third conductive pattern is provided at a same layer as the auxiliary electrode, and the third insulation layer is provided at a same layer as the display region protection layer.

For example, in the display substrate provided by at least one embodiment of the present disclosure, the pixel structure further includes a storage capacitor, and the storage capacitor includes a first storage capacitor electrode and a second storage capacitor electrode, and the lead wires is provided at a same layer as one of the first storage capacitor electrode and the second storage capacitor electrode of the storage capacitor.

For example, in the display substrate provided by at least one embodiment of the present disclosure, the first bonding region includes a bonding boundary region, and the bonding boundary region is between the first bonding region and the bonding peripheral region, the bonding boundary region includes a marking metal layer between the first insulation layer and the second insulation layer, and the marking metal layer is provided at a same layer as one of the first conductive pattern and the second conductive pattern.

At least one embodiment of the present disclosure further provides a display device, which includes the display substrate provided by any one of the embodiments of the present disclosure.

At least one embodiment of the present disclosure further provides a manufacturing method of a display substrate, which includes: providing a base substrate, the base substrate including a display region, a dam region at least partially surrounding the display region, a transition region on a side of the dam region away from the display region, a first bonding region on a side of the transition region away from the dam region, and a bonding peripheral region on the side of the transition region away from the dam region, and the bonding peripheral region being between the first bonding region and the transition region; forming lead wires in the first bonding region; forming a plurality of contact pads in the first bonding region, the plurality of contact pads being formed to be electrically connected to the lead wires, respectively; forming a first insulation laminated layer in the first bonding region; and forming a second insulation laminated layer in the bonding peripheral region, so that at least two insulation layers of the second insulation laminated layer extend into the first bonding region to form the first insulation laminated layer, and a thickness of the first insulation laminated layer along a direction perpendicular to the base substrate is smaller than a thickness of the second insulation laminated layer along the direction perpendicular to the base substrate.

For example, in the manufacturing method provided by at least one embodiment of the present disclosure, forming the second insulation laminated layer includes: forming a first insulation layer of the second insulation laminated layer on the base substrate, and forming a second insulation layer of the second insulation laminated layer on a side of the first insulation layer away from the base substrate, wherein the first insulation layer and the second insulation layer extend into the first bonding region to form the first insulation laminated layer.

For example, the manufacturing method provided by at least one embodiment of the present disclosure further includes: forming a pixel structure in the display region, wherein the pixel structure includes a pixel drive circuit, a first planarization layer, a first transfer electrode, a second planarization layer, and a light-emitting element, forming the pixel structure in the display region includes: forming the pixel drive circuit on the base substrate, wherein a thin film transistor is formed in the pixel drive circuit, and a gate electrode, a source electrode, a drain electrode, and an interlayer insulation layer are formed in the thin film transistor, and the interlayer insulation layer is on a side of the gate electrode away from the base substrate and on a side of the source electrode and the drain electrode close to the base substrate, forming the first planarization layer on a side of the pixel drive circuit away from the base substrate to provide a first planarization surface, and forming a first via hole in the first planarization layer, forming the first transfer electrode on the first planarization surface, wherein the first transfer electrode is electrically connected to one of the source electrode and the drain electrode through the first via hole, forming the second planarization layer on a side of the first transfer electrode away from the base substrate to provide a second planarization surface, and forming a second via hole in the second planarization surface, and forming the light-emitting element on the second planarization surface, wherein the light-emitting element is electrically connected to the first transfer electrode through the second via hole.

For example, in the manufacturing method provided by at least one embodiment of the present disclosure, forming the second insulation layer includes: depositing a first insulation material layer on the base substrate after forming a second conductive pattern of a conductive pattern lamination layer and the pixel drive circuit; patterning the first insulation material layer, so that a part of the first insulation material layer in the display region is formed into the second planarization layer, forming the second via hole in the second planarization layer, removing a part of the first insulation material layer overlapping with the second conductive pattern, and thinning a part of the first insulation material layer in the first bonding region to form the second insulation layer, so that a height of the second insulation layer relative to the base substrate in the first bonding region is smaller than a height of the second insulation layer relative to the base substrate in the bonding peripheral region, and the second insulation layer covers an edge of the second conductive pattern.

For example, in the manufacturing method provided by at least one embodiment of the present disclosure, patterning the first insulation material layer includes: patterning the first insulation material layer by using a gray tone mask plate patterning process or a halftone mask plate patterning process.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
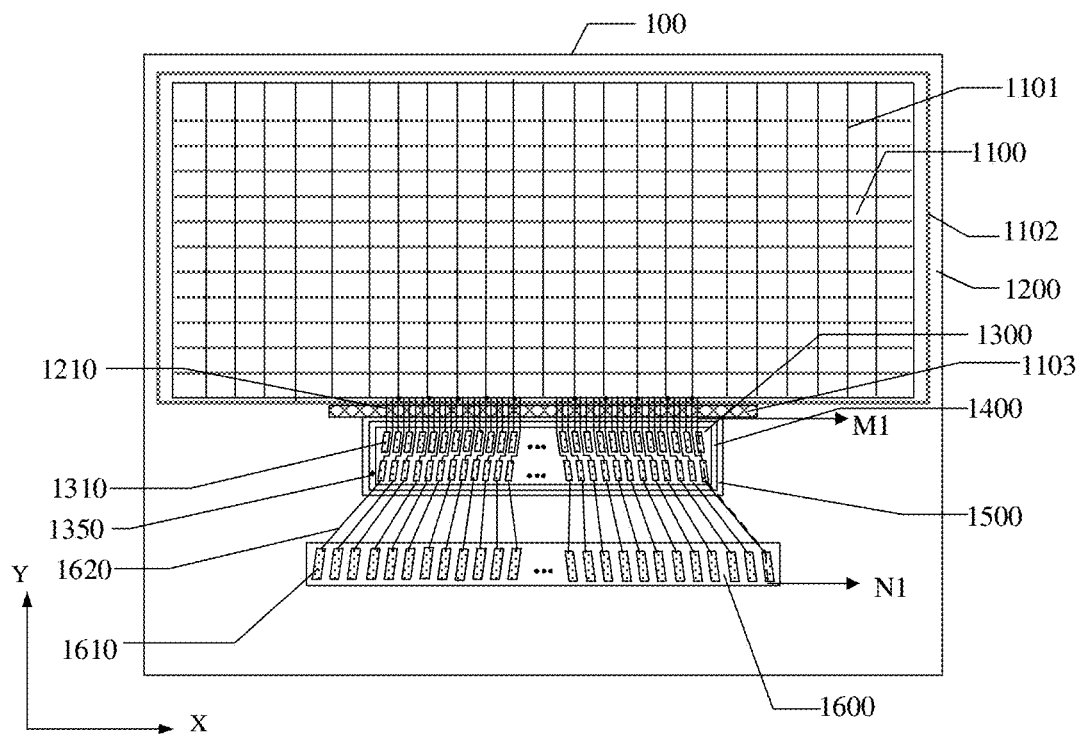
FIG. 1A is a plan view of a display substrate provided by an embodiment of the present disclosure.

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," and the like are only used to indicate relative position relationship, and when the position of the described object is changed, the relative position relationship may be changed accordingly.

At present, how to reduce the thickness of the display device and achieve a better touch experience has become a hot research topic in the industry. A display device using Flexible Multilayer on-cell Touch (FMLOC) technology can obtain a thinner display device by directly fabricating a touch sensor on the display substrate by a traditional deposition process, a traditional coating process, a traditional exposure process, and a traditional etching process. In order to further improve the display effect of the display device and display uniformity of the display device, the resistance of lead wires is reduced by adding a transfer electrode layer in the display substrate, thereby improving the display unevenness.

The inventors during the research, have noticed that in the above design scheme of the display device, with the increase of the amount of film layers of the display device, the film laminated structure of the display device becomes more complex, which will cause some other process problems. For example, in the bonding region of the display substrate configured to bond external circuits, the external circuits may include a flexible printed circuit board (for example, Chip On Film, COF) on which a control chip or a driving chip is arranged. The increase of the amount of film layers will lead to the increase of the film layer difference in the boundary region of the bonding region, and then more bubbles will easily appear in the bonding process at the film layer difference in the boundary region. These bubbles will directly affect the bonding effect of the bonding region. In severe cases, these bubbles may lead to the inability to identify an alignment mark in the bonding process, thus enabling it impossible to bond the external circuit to the bonding region and reducing the yield of products.

In view of the above problems, at least one embodiment of the present disclosure provides a display substrate and a manufacturing method thereof, and a display device.

At least one embodiment of the present disclosure provide a display substrate, which includes a base substrate, lead wires, a plurality of contact pads, a first insulation laminated layer, and a second insulation laminated layer. The base substrate including a display region, a dam region at least partially surrounding the display region, a transition region on a side of the dam region away from the display region, a first bonding region on a side of the transition region away from the dam region, and a bonding peripheral region on the side of the transition region away from the dam region, the bonding peripheral region is located between the first bonding region and the transition region; the lead wires located in the first bonding region; the plurality of contact pads, located in the first bonding region and configured to be electrically connected to the lead wires; the first insulation laminated layer, located in the first bonding region; and the second insulation laminated layer, located in the bonding peripheral region, at least two insulation layers of the second insulation laminated layer extend into the first bonding region to obtain the first insulation laminated layer, a thickness of the first insulation laminated layer along a direction perpendicular to the base substrate is smaller than a thickness of the second insulation laminated layer along the direction perpendicular to the base substrate.

In the display substrate of the above embodiment, the first insulation laminated layer is arranged on the bonding boundary region, and the height of the first insulation laminated layer relative to the base substrate is smaller than the height of the second insulation laminated layer located in the bonding peripheral region relative to the base substrate, so that the height of the film layer difference in the bonding peripheral region is reduced, the risk of bubbles generated in the bonding peripheral region and the bonding boundary region is reduced, which is helpful to complete the bonding process and improve the product yield of the display substrate and reliability of the display substrate.

Next, a display substrate and a manufacturing method thereof, and a display device provided according to an embodiment of the present disclosure will be described with reference to the accompanying drawings.

It should be noted that in each accompanying drawings of the present disclosure, for the sake of clear description, a spatial rectangular coordinate system is established based on the base substrate of the display substrate, and the positions of various structures in the display substrate are explained accordingly. In this spatial rectangular coordinate system, X axis and Y axis are parallel to the surface of the base substrate, and Z axis is perpendicular to the surface of the base substrate.

Figure 1B:
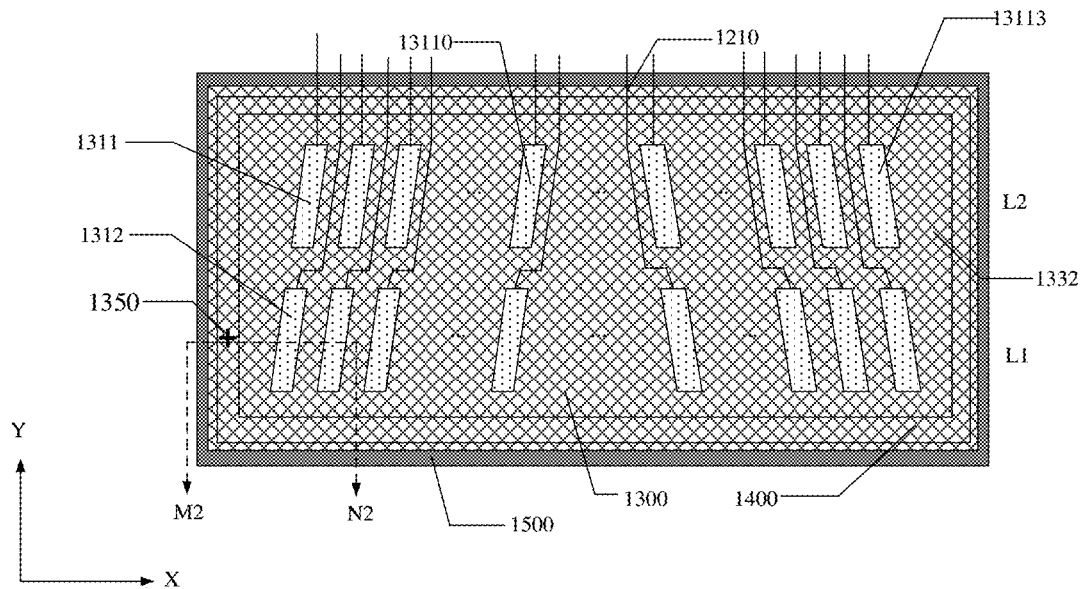
FIG. 1B is a plan view of a first bonding region of a display substrate provided by an embodiment of the present disclosure.

At least one embodiment of the present disclosure provides a display substrate, FIG. 1A is a plan view of a display substrate provided by an embodiment of the present disclosure. FIG. 1B is a plan view of a first bonding region of a display substrate provided by an embodiment of the present disclosure. A display substrate is used for, for example, an organic light-emitting diode (OLED) display device or a quantum dot light-emitting diode (QLED) display device.

In the present embodiment, as shown in FIG. 1A, the display region 1100 includes a plurality of sub-pixels and a plurality of signal lines 1101, and the plurality of signal lines 1101 include signal lines (for example, gate lines G) extending in a first direction (X-axis direction in the figure) and signal lines (for example, data lines D) extending in a second direction (Y-axis direction in the figure). These signal lines extend or route to the first bonding region located on at least a side of the display region 1100. For example, the signal lines 1101 are electrically connected to the corresponding lead wires, so that the signal lines 1101 can be electrically connected to the drive chips and flexible printed circuit board which are bonded in the first bonding region. The signal lines 1101 may be provided as scanning lines (gate lines), data lines, power lines, detection lines, etc., which provide control signals, data signals, voltage signals, etc., for the pixel array.

For example, as shown in FIG. 1A and FIG. 1B, the display substrate 100 includes a base substrate including a display region 1100 and a display peripheral region 1200 surrounding the display region 1100. The display peripheral region 1200 includes a dam region 1102 surrounding the display region and a transition region 1103 on a side of the display region 1100. The dam region 1102 includes a barrier dam, and the barrier dam may be formed as one-layer structure or a more-layers structure. The base substrate further includes a first bonding region 1300 and a bonding peripheral region 1500 on a side of the display region 1100. The first bonding region 1300 includes a bonding boundary region 1400. The bonding boundary region 1400 is located between the first bonding region 1300 and the bonding peripheral region 1500. For example, the first bonding region 1300 may use a Chip on Pi technology to bond an integrated circuit chip to a flexible substrate (such as a Pi substrate) of a display substrate. For example, the display peripheral region 1200 further includes a second bonding region located on a side of the first bonding region 1300 away from the display region 1100. The second bonding region may be a region using FOP (a flexible printed circuit board on Pi) double-sided bonding process. The figure shows one first bonding region 1300, but the amount of the first bonding regions of the present disclosure is not limited to this case. For example, as shown in FIG. 1A and FIG. 1B, the display substrate 100 may further include a plurality of lead wires 1210 and a plurality of contact pads 1310, and the plurality of contact pads 1310 is arranged on the first bonding region 1300. The plurality of contact pads 1310 includes a plurality of first contact pads 1311 and a plurality of second contact pads 1312. The plurality of first contact pads 1311 are located on a side of the first bonding region 1300 close to the display region, and the plurality of second contact pads 1312 are located on a side of the first bonding region 1300 away from the display region. The plurality of second contact pads 1312 are arranged in at least one row (one row as shown), and the plurality of first contact pads 1311 are arranged in at least one row (one row as shown). Here, the direction of the row is the direction in which the first bonding region 1300 extends facing the display region 1100. The plurality of first contact pads 1311 and the plurality of second contact pads 1312 may also be arranged in a plurality of rows, the embodiments of the present disclosure are not limited to this case. The plurality of lead wires 1210 are electrically connected to the plurality of contact pads 1310 in one-to-one correspondence. One end of one of the plurality of lead wires 1210 extends to the display region 1100 to be electrically connected to a corresponding signal line (for example, data line) in the display region 1100, and the other end of one of the plurality of lead wires 1210 extends to the first bonding region 1300 to be electrically connected to the plurality of contact pads 1310. For example, the plurality of lead wires 1210 are arranged in the same layer as the signal lines in the display region 1100, so that the plurality of lead wires 1210 and the signal lines can be integrally formed or formed in different layers, so that the plurality of lead wires 1210 and the signal lines need to be electrically connected to each other through via holes in the interlayer insulation layer between the plurality of lead wires 1210 and the signal lines.

In an example of the present disclosure, the plurality of first contact pads 1311 and the plurality of second contact pads 1312 are configured to transmit signals, such as display signals, of an external circuit to the plurality of lead wires of the display region.

For example, as shown in FIG. 1A, the display substrate 100 further includes a plurality of second bonding region lead wires 1620 and a plurality of third contact pads 1610. The plurality of second bonding region lead wires 1620 are electrically connected to the plurality of third contact pads 1610 correspondingly, for example, the plurality of second bonding region lead wires 1620 are electrically connected to the plurality of third contact pads 1610 in one-to-one correspondence, or multiple of contact pads are electrically connected to one lead wires, for example, the plurality of third contact pads 1610 are electrically connected to one of the plurality of second bonding region lead wire 1620, the present embodiment is not limited in this aspect. One end of plurality of the second bonding region lead wires 1620 extends to the first bonding region 1300 to be electrically connected to the plurality of second contact pads 1312, and the other end of the plurality of second bonding region lead wires 1620 extends to the second bonding region 1600 to be electrically connected to the plurality of third contact pads 1610.

In an example of the present disclosure, the plurality of third contact pads 1610 are configured to transmit signals of the external circuit, such as display signals, to the plurality of second contact pads in the first bonding region, and then the plurality of second contact pads transmits the signals to the plurality of lead wires in the display region.

Figure 1C:
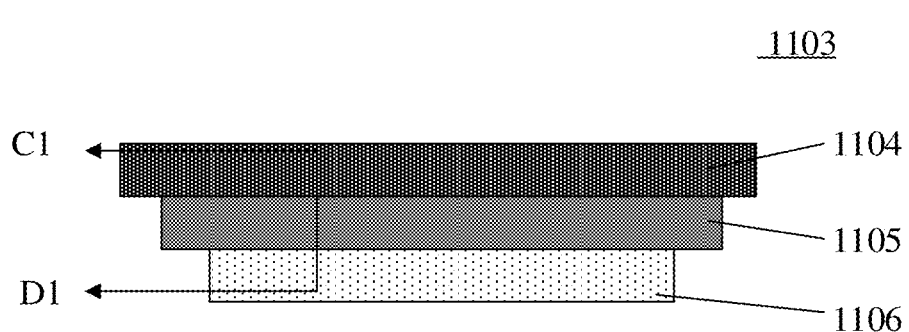
FIG. 1C is a plan view of a transition region of a display substrate provided by an embodiment of the present disclosure.

For example, as shown in FIG. 1C, the transition region 1103 includes a first fan-out region 1104, a bending region 1105, and a second fan-out region 1106. The first fan-out region 1104 is on a side of the transition region 1103 close to the display region 1100, the second fan-out region 1106 is on a side of the transition region 1103 close to the first bonding region 1300, and the bending region is located between the first fan-out region 1105 and the second fan-out region 1106.

The sectional line M1-N1 in FIG. 1A passes through a first contact pad 1311, a second contact pad 1312 in the first bonding region 1300, and a third contact pad 1610 in the second bonding region 1600 to show a film change relationship between the first bonding region 1300 and the second bonding region 1600.

For example, as shown in FIG. 1B, in the first bonding region 1300, there are gaps between the plurality of first contact pads 1311 in the same row or between the plurality of second contact pads 1312 in the same row, and there are also gaps between the plurality of first contact pads 1311 and the plurality of second contact pads 1312. The contact pad 1311 includes a conductive pattern lamination layer 13110. As shown in the figure, the sectional line M2-N2 passes through two second contact pads 1312, close to the bonding boundary region 1400, in a L1 row, and passes through the bonding boundary region 1400 and the bonding peripheral region 1500 to show the film change relationship among the first bonding region 1300, the bonding boundary region 1400, and the bonding peripheral region 1500.

In some embodiments of the present disclosure, the film change at the sectional line M2-N2 of the first bonding region 1300 is the same as the film change at its symmetrical position, and the case as shown in FIG. 1B is taken as an example for explanation.

For example, as shown in FIG. 1B, the display substrate 100 further includes a first insulation laminated layer 1320 and a second insulation laminated layer 1330. The first insulation laminated layer 1320 is in the bonding boundary region 1400, and the second insulation laminated layer 1330 is in the bonding peripheral region 1500. The first insulation laminated layer 1320 is located on a top layer, extends to the first bonding region 1300, and covers the edges of the plurality of contact pads 1310.

For example, as shown in FIG. 1B, the plurality of lead wires 1210 connected to the plurality of second contact pads 1312 extend through the gaps of the plurality of first contact pads 1311 in the first bonding region 1300, and then extend to the display region 1100, so that the plurality of contact pads 1310 has a larger arrangement space and can avoid mutual interference or short circuit with the plurality of lead wires 1210 connected to the plurality of first contact pads 1311.

In other examples, the plurality of lead wires 1210 may also be located in different layers, for example, a part of the plurality of lead wires 1210 for connecting the plurality of second contact pads 1312 are located in a layer closer to the base substrate, while another part of the plurality of lead wires 1210 for connecting the first contact pads 1311 are located in a layer relatively away from the base substrate 1000 (but still located between the plurality of contact pads and the base substrate). Therefore, space distances between the plurality of lead wires 1210 in the same layer are needed to be increased, and the risk of interference and short circuit between the plurality of lead wires is reduced, which is beneficial to forming a display device with high pixel resolution. Furthermore, the plurality of lead wires 1210 in the same layer can be manufactured in the same patterning process, and the plurality of lead wires 1210 in different layers may be manufactured in different patterning processes.

For example, the material of the plurality of lead wires 1210 may include a metal material or an alloy material, such as a metal single-layer structure or a metal multi-layer structure formed by molybdenum, aluminum, titanium, etc.

Figure 2A:
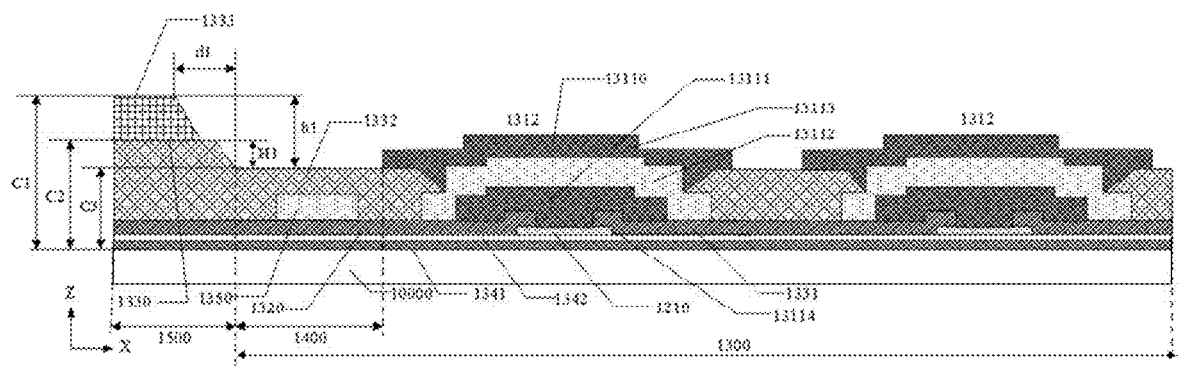
FIG. 2A is a schematic cross-sectional view of the display substrate as shown in FIG. 1B along line M2-N2.

For example, FIG. 2A is a schematic cross-sectional view of the display substrate as shown in FIG. 1B along line M2-N2. As shown in FIG. 1A, a contact pad 1312 is located on the side of lead wires 1210 away from the base substrate 1000. At least two insulation layers of the second insulation laminated layer 1330 extend into the bonding boundary region 1400 to form the first insulation laminated layer 1320. A height C3 of the first insulation laminated layer 1320 relative to the base substrate 1000 is smaller than a height C1 of the second insulation laminated layer 1330 relative to the base substrate 1000. Further, the height of the film layer difference in the bonding peripheral region is reduced, so that the risk of bubble generation in the bonding peripheral region and the bonding boundary region is reduced, and the product yield and reliability of the display substrate are improved.

For example, the base substrate 1000 may be a glass plate, a quartz plate, a metal plate, a resin plate, etc. For example, the material of the base substrate may include an organic material, for example, the organic material may be a resin material, such as polyimide (Pi), polycarbonate, polyacrylate, polyetherimide, polyethersulfone, polyethylene terephthalate, and polyethylene naphthalate, etc., the base substrate 1000 may be a flexible substrate or a non-flexible substrate, and the embodiments of the present disclosure are not limited thereto.

For example, as shown in FIG. 2A, the second insulation laminated layer 1330 includes a first insulation layer 1331 and a second insulation layer 1332 in the bonding peripheral region 1500. The first insulation layer 1331 is located on the base substrate 1000, and the second insulation layer 1332 is located on a side of the first insulation layer 1331 away from the base substrate 1000. The first insulation layer 1331 and the second insulation layer 1332 extend into the bonding boundary region 1400 to form the first insulation laminated layer 1320. Relative to with the base substrate 1000, the height C3 of the second insulation layer 1332 in the bonding boundary region 1400 is smaller than the height C2 of the second insulation layer 1332 in the bonding peripheral region 1500, that is, the second insulation layer 1332 is integrally arranged in the bonding boundary region 1400 and the bonding peripheral region 1500, but has different heights. As shown in the figure, the parts of the second insulation layer 1332 with different heights can be continuously transitioned, for example, the second insulation layer 1332 has a slope angle with respect to the base substrate, which is about 40 degrees to 60 degrees, and for example, is about 50 degrees. It should be noted that the height of the second insulation layer 1332 refers to a vertical distance from the surface of the second insulation layer 1332 to the surface of the base substrate 1000. The film thickness of the second insulation layer 1332 in the bonding boundary region 1400, that is, a vertical distance between the upper surface and the lower surface of the second insulation layer 1332, can range from about 1.0 microns to 1.4 microns, for example, the vertical distance can be about 1.2 microns. The film thickness of the second insulation layer 1332 in the bonding peripheral region 1500 can range from about 1.8 microns to 2.2 microns, for example, and the value of the film thickness can be about 2 microns. Therefore, the height difference H1 between the height C2 of the second insulation layer 1332 in the bonding peripheral region 1500 and the height H1 of the second insulation layer 1332 in the bonding boundary region 1400 can range from about 0.4 microns to 1.2 microns, or for example, the value of the height difference H1 can be about 0.8 microns. The height difference between the film layers in the bonding peripheral region and the film layers in the bonding boundary region, that is, the film layer segment difference, is reduced, so that the risk of bubble generation in the bonding peripheral region and the bonding boundary region is reduced, and the product yield and reliability of the display substrate is improved.

In the embodiments of the present disclosure, the word "about" indicates the variation range of a given numerical value, which is within 15% of the numerical value, for example, within 5% of the numerical value, or within 10% of the numerical value, etc.

For example, the material of the first insulation layer 1331 may include inorganic insulation materials, such as silicon oxide, silicon nitride, silicon oxynitride, etc., or organic insulation materials, such as polyimide (Pi), phthalimide, phthalamide, acrylic resin, benzocyclobutene, or phenolic resin, etc. The embodiments of the present disclosure are not specifically limited to the material of the first insulation layer. The material of the second insulation layer 1332 may include inorganic insulation materials, such as silicon oxide, silicon nitride, silicon oxynitride, etc., or organic insulation materials, such as polyimide, phthalimide, phthalamide, acrylic resin, benzocyclobutene, or phenolic resin, etc. The embodiments of the present disclosure are not specifically limited to the material of the second insulation layer.

For example, as shown in FIG. 2A, at least two insulation layers of the second insulation laminated layer 1330 further include a third insulation layer 1333. The third insulation layer 1333 is located on a side of the second insulation layer 1332 away from the base substrate 1000 and is configured to expose the second insulation layer 1332 on a side close to the plurality of contact pads 1310. The side of the third insulation layer 1333 close to the bonding boundary region 1320 has the edge of a slope angle, which is not aligned with the edge of a slope angle on a side of the second insulation layer 1332 close to the bonding boundary region 1320 at the bonding peripheral region 1330. The distance between an edge of the third insulation layer 1333 and the bonding boundary region 1320 is greater than the distance between an edge of the second insulation layer 1332 and the bonding boundary region 1320. The larger the distance between the third insulation layer and the bonding boundary region, the more beneficial it will be to reduce the risk of bubble generation in the bonding process. In addition, the third insulation layer 1333 can also protect the surrounding lead wires. The film thickness of the third insulation layer 1333 may be about 3 microns. The height difference H1 between the height C2 of the second insulation layer 1332 in the bonding peripheral region 1500 and the height of the second insulation layer 1332 in the bonding boundary region 1400 plus the thickness of the third insulation layer 1333 is the difference h1 between the height C1 of the second insulation laminated layer 1330 from the base substrate 1000 and the height C3 of the first insulation laminated layer 1320 from the base substrate 1000, and the difference h1 can range from about 3.4 microns to 4.2 microns, for another example the value of the difference h1 can be about 3.8 microns. On the other hand, in the direction parallel to the base substrate 1000, the distance d1 obtained by projecting the difference h1 on the base substrate ranges from about 100 microns to 200 microns.

For example, the material of the third insulation layer 1333 may include organic insulation materials. The organic insulation materials can be polymer materials containing desiccant or polymer materials that can block water vapor, such as polymer resin, etc.

For example, as shown in FIG. 2A, the display substrate 100 further includes a bonding region buffer layer 1341 located above the base substrate 1000 and a bonding region gate insulation layer 1342 located on a side of the bonding region buffer layer 1341 away from the base substrate 1000. A lead wire 1210 is located on the bonding region gate insulation layer 1342. One end of the lead wire 1210 is electrically connected to the contact pad 1311. The first insulation layer 1331 extends to the first bonding region between the contact pad 1311 and the lead wire 1210.

For example, the conductive pattern lamination layer of the plurality of contact pads includes at least two conductive patterns, and at least one insulation layer of the first insulation laminated layer covers an edge of one of the at least two conductive patterns and an edge of the at least one insulation layer is covered by the other of the at least two conductive patterns.

For example, as shown in FIG. 2A, the conductive pattern lamination layer 13110 includes a first conductive pattern 13111 and a second conductive pattern 13112. The first conductive pattern 13111 is located on a side of the lead wire 1210 away from the base substrate 1000 and is electrically connected to the lead wire 1210. The second conductive pattern 13112 is located on a side of the first conductive pattern 13111 away from the base substrate 1000 and covers an edge of the first conductive pattern 13111 to avoid the first conductive pattern 13111 being corroded by etching solution. The first insulation layer 1331 is located between the first conductive pattern 13111 and the lead wire 1210, so that the first conductive pattern 13111 is electrically insulated from the lead wire 1210. A first conductive pattern via hole 13114 is formed in the first insulation layer 1331. The first conductive pattern 13111 and the lead wire 1210 are electrically connected through the first conductive pattern via hole 13114. The second insulation layer 1332 in the first insulation laminated layer 1320 extends to the first bonding region to cover the edge of the second conductive pattern 13112, so as to prevent the second conductive pattern 13112 from being corroded. The second conductive pattern 13112 is configured to be exposed relative to the first insulation laminated layer 1320 for being electrically connected to an external circuit.

For example, the material of the first conductive pattern 13111 may include a metal material or an alloy material, such as a metal single-layer structure or a metal multi-layer structure formed by molybdenum, aluminum, titanium, etc. The material of the second conductive pattern 13112 may include a metal material or an alloy material, such as a metal single-layer structure or a metal multi-layer structure formed by molybdenum, aluminum, titanium, etc.

For example, as shown in FIG. 2A, the conductive pattern lamination layer 13110 further includes a third conductive pattern 13113. The third conductive pattern 13113 is located on a side of the second conductive pattern 13112 away from the base substrate 1000, and covers an edge of the second insulation layer 1332 of the first insulation laminated layer 1320. Here, the edge of the second insulation layer refers to the edge where the second insulation layer 1332 is broken on the second conductive pattern 13112.

For example, the material of the third conductive pattern 13113 may include a metal material or an alloy material, such as a metal single-layer structure or a metal multi-layer structure formed by molybdenum, aluminum, titanium, etc.

For example, as shown in FIG. 1A, FIG. 1B, and FIG. 2A, the bonding boundary region 1400 further includes a marking metal layer 1350 between the first insulation layer 1331 and the second insulation layer 1332, which is configured to align an external circuit during the bonding process. The marking metal layer may be arranged in the same layer as the first conductive pattern 13111 or the second conductive pattern 13112. The embodiments of the present disclosure have no restrictions on the planar pattern of the marking metal layer, and may be, for example, a cross shape, a square shape, a rectangle shape, etc.

For example, in some example of the present disclosure, the plurality of third contact pads in the second bonding region include a plurality of contact pad metal layers. The plurality of contact pad metal layers include a first contact pad metal layer and a second contact pad metal layer, the first contact pad metal layer is provided on a side of the first insulation layer away from the base substrate, and the second contact pad metal layer is laminated with the first contact pad metal layer and covers a periphery of the second contact pad metal layer. Here, the first contact pad metal layer is provided at the same layer as the first conductive pattern layer, and the second contact pad metal layer is provided at the same layer as the second conductive pattern layer.

For example, in some example of the present disclosure, the second contact pad metal layer extends toward the first bonding region to form the second bonding region lead wires, and the second insulation layer extends to the second bonding region and covers the second bonding region lead wires and an edge of the second contact pad metal layer.

For example, in some example of the present disclosure, a thickness of a part of the second insulation layer located between the first bonding region and the second bonding region along the direction perpendicular to the base substrate is substantially the same as a thickness of a part of the second insulation layer located in the first bonding region along the direction perpendicular to the base substrate, and an orthographic projection of the second insulation layer between the first bonding region and the second bonding region on the base substrate at least partially overlaps with an orthographic projection of the second bonding region lead wires on the base substrate. For example, in some example of the present disclosure, the conductive pattern lamination layer further includes a third conductive pattern, and the third conductive pattern is located on a side of the second conductive pattern away from the base substrate, and an edge of the second insulation layer of the first insulation laminated layer is covered by the third conductive pattern. The third contact pad metal layer and the third conductive pattern layer are arranged in the same layer.

Figure 2B:
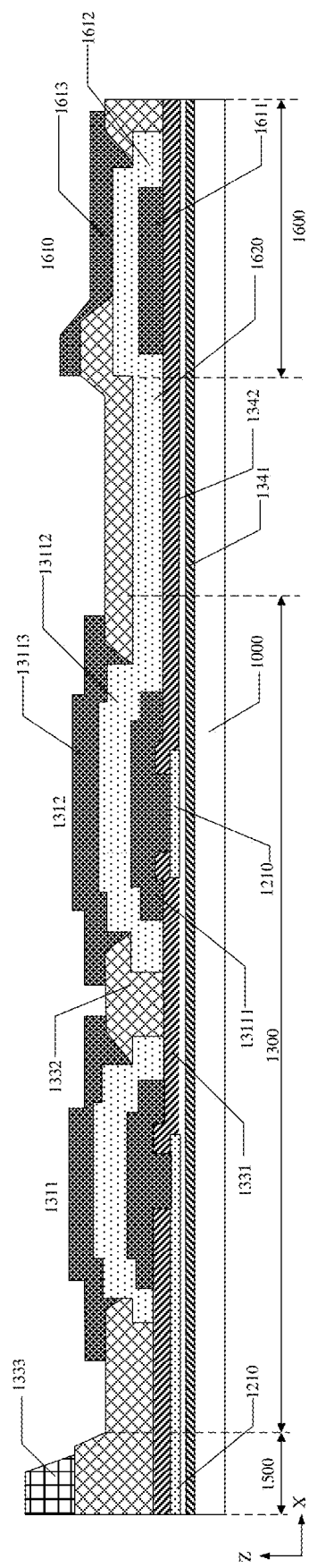
FIG. 2B is a schematic cross-sectional view of the display substrate as shown in FIG. 1B along line M2-N2.

For example, in some example of the present disclosure, FIG. 2B is a schematic cross-sectional view of the display substrate as shown in FIG. 1B along line M2-N2. As shown in FIG. 2B, the bonding region buffer layer 1341 and the bonding region gate insulation layer 1342 further extend to the second bonding region 1600. A lead wire 1210 connecting a first contact pad 1311 further extends to the bonding boundary region 1500. The film laminated layer in the bonding boundary region 1500 includes the lead wire 1210, a first insulation layer 1331, a second insulation layer 1332, and a third insulation layer 1333. The thickness of the second insulation layer 1332 in the bonding peripheral region is greater than the thickness of the second insulation layer 1332 in the first bonding region, and the difference of thicknesses of the second insulation layer 1332 is approximately the same as the value of the height difference H1 as shown in FIG. 2A. A third contact pad 1610 includes a first contact pad metal layer 1611, a second contact pad metal layer 1612, and a third contact pad metal layer 1613. The first contact pad metal layer 1611 is located on the bonding region gate insulation layer 1342, and the first contact pad metal layer 1611 and the first conductive pattern 13111 are arranged on the same layer, so that the first contact pad metal layer 1611 and the first conductive pattern 13111 can be manufactured by the same patterning process to simplify the process flow. The second contact pad metal layer 1612 is located on a side of the first contact pad metal layer 1611 away from the base substrate and covers the edge of the first contact pad metal layer 1611 to prevent the first contact pad metal layer 1611 from being corroded by etching solution. A second bonding region lead wire 1620 is formed in a space between the edge of the first contact metal layer 1611 close to the first bonding region 1300 and the edge of the second conductive pattern 13112 close to the second bonding region 1600. The second contact pad metal layer 1612 extends toward the first bonding region 1300 to form a second bonding region lead wire 1620. The second insulation layer 1332 extends to the second bonding region 1600 and covers the edge of the second bonding region lead wire 1620 and the second contact pad metal layer 1612. In addition, the second contact pad metal layer 1612 and the second conductive pattern 13112 are arranged on the same layer, so that the second contact pad metal layer 1612 and the second conductive pattern 13112 can be manufactured by the same patterning process to simplify the process flow. The second insulation layer 1332 located between the first bonding region 1300 and the second bonding region 1600 is located on the side of the second conductive pattern 13112 away from the base substrate 1000, and extends to the second bonding region 1600 and covers the edge of the second contact pad metal layer 1612 to avoid corrosion of the second contact pad metal layer 1612. The third contact pad metal layer 1613 is located on the side of the second contact pad metal layer 1612 away from the base substrate 1612 and covers the edge of the second insulation layer 1332. The third contact pad metal layer 1613 may be arranged in the same layer as the third conductive pattern 13113. Therefore, the third contact pad metal layer 1613 and the third conductive pattern 13113 can be manufactured by the same patterning process to simplify the manufacturing process flow. The third contact pad metal layer 1613 is configured to be exposed relative to the second insulation layer 1332 for being electrically connected to an external circuit.

In the embodiments of the present disclosure, "arrangement in the same layer" means that two functional layers (for example, the first contact pad metal layer and the first conductive pattern) are formed on the same layer and of the same material in the hierarchical structure of the display substrate, that is, in the manufacturing process, the two structural layers can be formed by the same material layer, and the required patterns and structures can be formed by the same patterning process. For example, the material layer can be formed at first and then the required patterns and structures may be formed by the patterning process with the material layer. Or, in the manufacturing process, the two structural layers may be formed by the same material layer, but the required patterns and structures are formed by different patterning processes. Or, in the manufacturing process, the two structural layers are located on the same layer, and the two structural layers can be formed of different material layers, and the required patterns and structures are formed by the same patterning process.

For example, in some example of the present disclosure, the display substrate further includes a third insulation laminated layer, located in the transition region, here the third insulation laminated layer includes a first insulation laminated sub-layer and a second insulation laminated sub-layer, an orthographic projection of the first insulation laminated sub-layer on the base substrate at least partially covers the transition region and the bonding peripheral region, and an orthographic projection of the second insulation laminated sub-layer on the base substrate at least partially covers the transition region and the bonding peripheral region.

For example, in some example of the present disclosure, the third insulation laminated layer further includes a third insulation laminated sub-layer that is provided between the first insulation laminated sub-layer and the second insulation laminated sub-layer, and an orthographic projection of the third insulation laminated sub-layer on the base substrate does not overlap with the first bonding region and the bonding peripheral region.

For example, in some example of the present disclosure, the first insulation laminated sub-layer extends to the bonding peripheral region to obtain the first insulation layer, and the second insulation laminated sub-layer extends to the bonding peripheral region to obtain the second insulation layer.

For example, in some example of the present disclosure, the second insulation laminated sub-layer 1108 and the third insulation laminated sub-layer 1109 at least partially overlap with the first fan-out region and the second fan-out region, respectively.

Figure 2C:
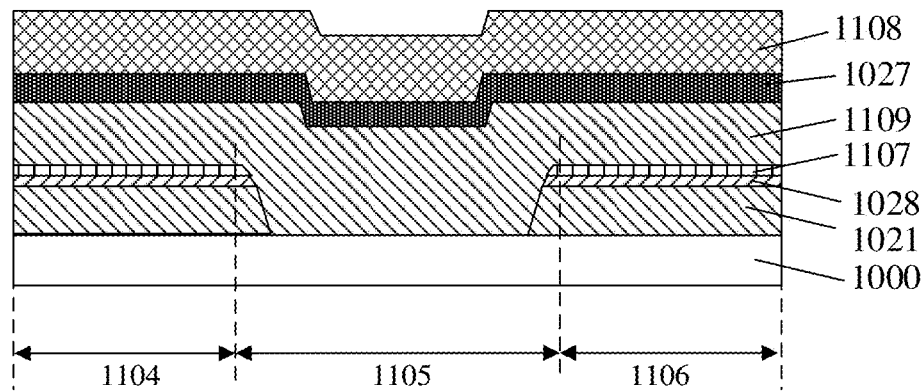
FIG. 2C is a schematic cross-sectional view of a display substrate provided by an embodiment of the present disclosure along line C1-D1 in the transition region as shown in FIG. 1C.

For example, as shown in FIG. 2C, the third insulation laminated layer includes a first insulation laminated sub-layer 1107, a second insulation laminated sub-layer 1108, and a third insulation laminated sub-layer 1109. The orthographic projection of the first insulation laminated sub-layer 1107 on the base substrate 1000 covers the first fan-out region 1104 and the second fan-out region 1106, that is, the first insulation laminated sub-layer 1107 is broken in the bending region 1105. The first insulation laminated sub-layer 1107 extends to the bonding peripheral region to obtain the first insulation layer 1331, so the first insulation laminated sub-layer is arranged on the same layer as the first insulation layer. The orthographic projection of the second insulation laminated sub-layer 1108 on the base substrate 1000 covers the first fan-out region 1104, the bending region 1105 and the second fan-out region 1106, and the second insulation laminated sub-layer 1108 extends to the bonding peripheral region to obtain the second insulation layer 1332, so that the second insulation laminated sub-layer is arranged on the same layer as the second insulation layer. The orthographic projection of the third insulation laminated sub-layer 1109 on the base substrate 1000 covers the first fan-out region 1104, the bending region 1105 and the second fan-out region 1106, and the third insulation laminated sub-layer 1109 does not overlap with the bonding peripheral region.

For example, as shown in FIG. 2C, the third insulation layer laminated layer further includes a transition buffer layer 1021, a transition gate insulation layer 1028, and a transition metal layer 1027. The transition buffer layer 1021 is arranged on the same layer as the bonding buffer layer 1341, the transition gate insulation layer 1028 is arranged on the same layer as the bonding gate insulation layer 1342, and the transition metal layer 1027 is arranged on the same layer as the first conductive pattern 13111.

For example, in some examples of the present disclosure, the sub-pixel of each pixel unit in the pixel array of the display region of the display substrate may also include a pixel structure. The pixel structure includes a pixel drive circuit, a first planarization layer, a first transfer electrode, a second planarization layer, and a light-emitting element. The first planarization layer is on a side of the pixel drive circuit away from the base substrate to provide a first planarization surface and includes a first via hole, the first transfer electrode is located on the first planarization surface and is electrically connected to the pixel drive circuit through the first via hole. The second planarization layer is located on a side of the first transfer electrode away from the base substrate to provide a second planarization surface and includes a second via hole. The light-emitting element is located on the second planarization surface and is electrically connected to the first transfer electrode through the second via hole. The second planarization layer is provided at the same layer as the second insulation layer, so that the manufacturing process of the display substrate is simplified, and the cost of products is reduced.

For example, the pixel drive circuit may include a thin film transistor, a storage capacitor, etc., may be implemented in various types, such as a 2T1C type (that is, including two thin film transistors and one storage capacitor), and may further include more transistors and/or capacitors based on the 2T1C type to have functions of compensation, reset, light-emitting control, detection, etc. The embodiments of the present disclosure are not limited to the type of the pixel drive circuit. For example, in some embodiments, the thin film transistor directly and electrically connected to the light-emitting element may be a drive transistor, or a light-emitting control transistor, etc.

Figure 3:
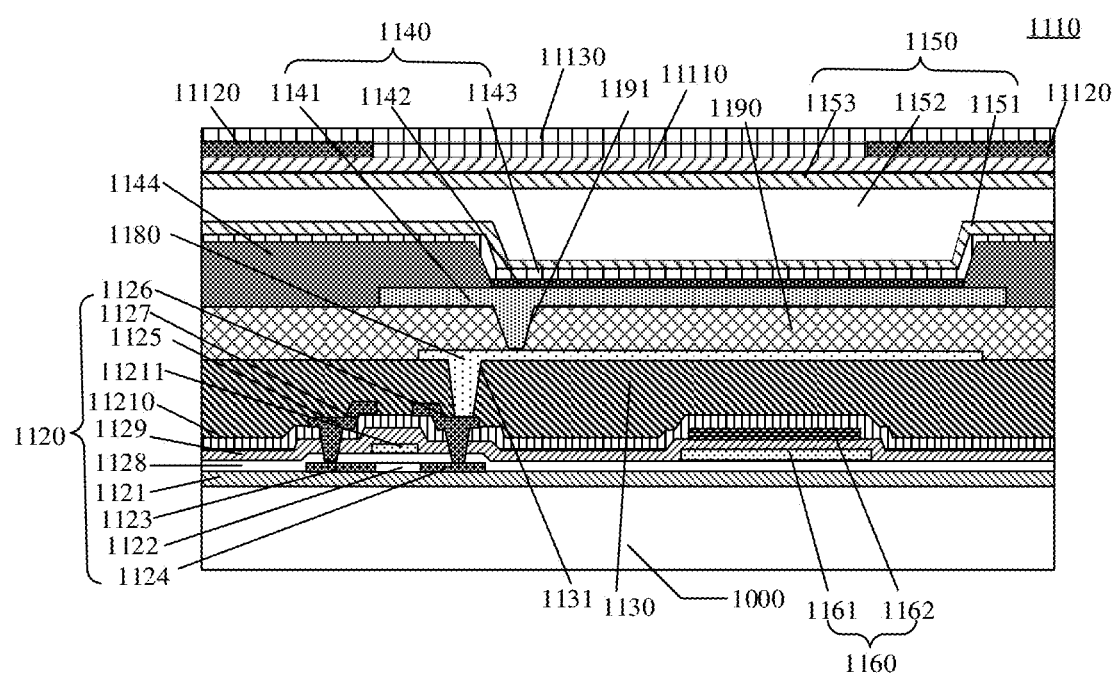
FIG. 3 is a schematic cross-sectional view of the display region of the display substrate as shown in FIG. 1A.

For example, in some examples of the present disclosure, FIG. 3 is a schematic cross-sectional view of the display region of the display substrate as shown in FIG. 1A. As shown in FIG. 3, sub-pixels of the display region of the display substrate 100 may also include a pixel structure 1110 for driving and controlling light emission. The pixel structure 1110 includes a pixel drive circuit 1120, a first planarization layer 1130, a first transfer electrode 1180, a second planarization layer 1190, and a light-emitting element 1140.

For example, the pixel structure 1110 also includes a buffer layer 1121 on the base substrate 1000. The pixel drive circuit 1120 may include an active layer 1122 on the buffer layer 1121, a gate insulation layer 1128 on a side of the active layer 1122 away from the substrate 1000, a gate electrode 11211 on the gate insulation layer 1128, an interlayer insulation layer 1129 located on a side of the gate electrode 11211 away from the base substrate 1000 and on a side of a source electrode and a drain electrode (a source electrode 1125 and a drain electrode 1126 in FIG. 3) close to the base substrate 1000, a fourth insulation layer (another interlayer insulation layer) 11210 located on the interlayer insulation layer 1129, and a source electrode 1125 and drain electrode 1126 located on the fourth insulation layer 11210. The gate electrode 11211 may be arranged in the same layer as the plurality of lead wires 1210 in the first bonding region 1300. Therefore, the gate electrode 11211 and the plurality of lead wires 1210 can be formed on the same layer in the manufacturing process, for example, by using the same material layer through the patterning process. The interlayer insulation layer 1129 may be arranged in the same layer as the first insulation layer 1331, so that the interlayer insulation layer 1129 and the first insulation layer 1331 can be formed on the same layer in the manufacturing process, for example, by using the same material layer through the patterning process. The buffer layer 1121 in the display region is arranged on the same layer as the transition buffer layer 1021 and the bonding buffer layer 1341, and the buffer layer 1121 and the transition buffer layer 1021, the bonding buffer layer 1341 can be formed on the same layer in the manufacturing process. The gate insulation layer 1128 in the display region is arranged on the same layer as the bonding region gate insulation layer 1342 and the transition region gate insulation layer 1028, and the gate insulation layer 1128 and the bonding region gate insulation layer 1342, the transition region gate insulation layer 1028 can be formed on the same layer in the manufacturing process. As a transition layer, the buffer layer 1121 can prevent harmful substances in the base substrate from intruding into the display substrate and increase the adhesion of the film layer in the display substrate 100 to the base substrate 1000.

For example, the material of the buffer layer 1121 may include insulation materials, such as silicon oxide, silicon nitride, and silicon oxynitride, etc. Materials of one or of more of the fourth insulation layer 11210, the interlayer insulation layer 1129, and the gate insulation layer 1128 may include insulation materials, such as silicon oxide, silicon nitride, and silicon oxynitride, etc. The materials of the fourth insulation layer 11210, the interlayer insulation layer 1129 and the gate insulation layer 1128 may be the same or different.

For example, as shown in FIG. 3, the active layer 1122 may include a source region 1123, a drain region 1124, and a channel region located between the source region 1123 and the drain region 1124. The fourth insulation layer 11210, the interlayer insulation layer 1129 and the gate insulation layer 1128 have via holes that is arranged to expose the source region 1123 and the drain region 1124. The source electrode 1125 and the drain electrode 1126 are electrically connected to the source region 1123 and the drain region 1124 through via holes, respectively. The gate electrode 11211 overlaps with the channel region between the source region 1123 and the drain region 1124 in the active layer 1122 in the direction perpendicular to the base substrate 1000. The first planarization layer 1130 is located above the source electrode 1125 and the drain electrode 1126 for planarizing the surface of the pixel drive circuit on the side away from the base substrate. The first planarization lay 1130 can planarize that uneven surface caused by the pixel drive circuit, and thus prevent irregularities caused by the pixel drive circuit from cause defects in the light-emitting device. A first via hole 1131 is formed in the first planarization layer 1130 to expose the source electrode 1125 or the drain electrode 1126 (as shown in the figure), and the first transfer electrode 1180 is formed on the first planarization layer 1130. The first transfer electrode 1180 is electrically connected to the drain electrode 1126 through the first via hole 1131, and the transfer electrode 1180 can avoid directly forming a through via hole with a relatively large aperture in the first planarization layer and a second planarization layer, thereby improving the electrical connection quality of the via hole. At the same time, the first transfer electrode can also be formed on the same layer as other signal lines (such as power lines, etc.), thus not causing an increase in process steps. The first transfer electrode 1180 is arranged on the same layer as the second conductive pattern 13112 of the plurality of contact pads 1310. Therefore, the first transfer electrode 1180 and the second conductive pattern 13112 can be formed on the same layer in the manufacturing process, for example, by using the same material layer through the patterning process, thus simplifying the manufacturing process.

For example, the material of the first transfer electrode 1180 may include a metal material or an alloy material, such as a metal single-layer structure or a metal multi-layer structure formed by molybdenum, aluminum, titanium, etc.

For example, the material of the active layer 1122 may include polysilicon or an oxide semiconductor (for example, indium gallium zinc oxide). The material of the gate electrode 11211 may include a metal material or an alloy material, such as a metal single-layer or a multi-layer structure formed by molybdenum, aluminum, titanium, etc., for example, the multi-layer structure is a multi-metal laminated layer (such as a three-layer metal laminated layer of titanium, aluminum, and titanium (Ti/Al/Ti). The material of the source electrode 1125 and the drain electrode 1126 may include a metal material or an alloy material, for example, a metal single-layer or a multi-layer structure formed by molybdenum, aluminum, titanium, etc., for example, the multi-layer structure is a multi-metal laminated layer (for example, a three-layer metal laminated layer of titanium, aluminum, and titanium (Ti/Al/Ti)). The embodiments of the present disclosure are not specifically limited to the material of each functional layer.

For example, in some examples of the present disclosure, as shown in FIG. 3, the pixel drive circuit 1120 may further include a first display metal layer 1127, and the first display metal layer 1127 is arranged on the same layer as the first conductive pattern 13111. The first display metal layer 1127 includes the source electrode 1125 and the drain electrode 1126 of the thin film transistor in the pixel drive circuit. The source electrode 1125 and the drain electrode 1126 are arranged on the same layer as the first conductive pattern 13111. Therefore, the source electrode 1125, the drain electrode 1126, and the first conductive pattern 13111 can be formed on the same layer in the manufacturing process, for example, by using the same material layer through patterning process, thereby simplifying the manufacturing process and reducing the manufacturing cost of products.

For example, in some examples of the present disclosure, as shown in FIG. 3, the second planarization layer 1190 is arranged on the side of the first transfer electrode 1180 away from the base substrate 1000 to provide a planarization surface on the side of the first transfer electrode 1180 away from the base substrate 1000. In addition, a second via hole 1191 is formed in the second planarization layer 1190. The second planarization layer 1190 is arranged on the same layer as the second insulation layer 1332, so that the second planarization layer 1190 and the second insulation layer 1332 can be formed on the same layer in the manufacturing process, for example, by using the same material layer through manufacturing process, thus simplifying the manufacturing process.

For example, continue as shown in FIG. 3, the light-emitting element 1140 is formed on the second planarization layer, that is, the light-emitting element 1140 is arranged on the side of the second planarization layer 1190 away from the base substrate. The light-emitting element 1140 includes a first electrode 1141, a light-emitting layer 1142, and a second electrode 1143. The first electrode 1141 of the light-emitting element is electrically connected to the drain electrode 1126 through the first via hole 1131 in the first planarization layer 1130. A pixel defining layer 1144 is formed on the first electrode 1141, and the pixel defining layer 1144 includes a plurality of openings to define a plurality of pixel units. Each of the plurality of openings exposes the first electrode 1141, and the light-emitting layer 1142 is arranged in the plurality of openings of the pixel defining layer 1144. The second electrode 1143 may be arranged, for example, in a part of or the whole of the display region, so that the second electrode 1143 may be formed on the whole surface in the manufacturing process.

For example, the first electrode 1141 may include a reflective layer, and the second electrode 1143 may include a transparent layer or a translucent layer. Thus, the first electrode 1141 may reflect light emitted from the light-emitting layer 1142, and the part of light is emitted into the external environment through the second electrode 1143, so that light emission rate may be provided. In the case where the second electrode 1143 includes a semi-transmissive layer, some light reflected by the first electrode 1141 is reflected again by the second electrode 1143, so that the first electrode 1141 and the second electrode 1143 form a resonant structure, thereby improving light emission efficiency.

For example, the material of the first electrode 1141 may include at least one transparent conductive oxide material, which includes indium tin oxide (ITO), indium zinc oxide (IZO), zinc oxide (ZnO), etc. In addition, the first electrode 1141 may adopt a metal having high reflectivity as a reflective layer, such as silver (Ag).

For example, for OLED, the light-emitting layer 1142 may adopt a small molecular organic material or a polymer molecular organic material, which may be a fluorescent light-emitting material or a phosphorescent light-emitting material, and may emit red light, green light, blue light, or white light. In addition, the light-emitting layer may further include functional layers such as an electron injection layer, an electron transport layer, a hole injection layer, a hole transport layer, and the like as required. For QLED, the light-emitting layer may adopt a quantum dot material, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc., and the particle size of the quantum dots ranges from 2-20 nm.

For example, the second electrode 1143 may adopt various conductive materials. For example, the second electrode 1143 may adopt a metal material such as lithium (Li), aluminum (Al), magnesium (Mg), silver (Ag), etc.

For example, the material of the pixel defining layer 1144 may include organic insulation materials, such as polyimide, polyphthalimide, polyphthalamide, acrylic resin, benzocyclobutene or phenolic resin, etc., or inorganic insulation materials, such as silicon oxide, silicon nitride, etc., and the embodiments of the present disclosure are not limited thereto.

For example, as shown in FIG. 3, the display substrate further includes a storage capacitor 1160, which may include a first capacitance electrode 1161 and a second capacitance electrode 1162. The first capacitor electrode 1161 is arranged between the gate insulation layer 1128 and the interlayer insulation layer 1129, and the second capacitor electrode 1162 is arranged between the interlayer insulation layer 1129 and the fourth insulation layer 11210. The first capacitor electrode 1161 and the second capacitor electrode 1162 are stacked, and are at least partially overlapped with each other in the direction perpendicular to the base substrate 1000. The first capacitor electrode 1161 and the second capacitor electrode 1162 adopt the interlayer insulation layer 1129 as a dielectric material to form the storage capacitor. The first storage capacitor electrode 1161 is arranged on the same layer as the gate electrode 11211 in the pixel drive circuit 1120 and the plurality of lead wires 1210 in the first bonding region 1300. Therefore, the first storage capacitor electrode 1161, the gate electrode 11211, and the plurality of lead wires 1210 can be formed on the same layer in the manufacturing process, for example, by using the same material layer through patterning process, thereby simplifying the manufacturing process and reducing the manufacturing cost of products.

In another example, as a variation of the example as shown in FIG. 3, the first capacitance electrode of the storage capacitor is still arranged on the same layer as the gate electrode 11211, while the second capacitance electrode of the storage capacitor is arranged on the same layer as the source electrode 1125 and the drain electrode 1126 of the thin film transistor (that is, also located in the first display metal layer 1127), whereby the first capacitance electrode and the second capacitance electrode adopt a stack of the interlayer insulation layer 1129 and the fourth insulation layer 11210 as dielectric materials to form the storage capacitor.

In still another example, as a variation of the example as shown in FIG. 3, the first capacitance electrode of the storage capacitor is no longer arranged on the same layer as the gate electrode 11211, but is located between the interlayer insulation layer 1129 and the fourth insulation layer 11210, while the second capacitance electrode of the storage capacitor is arranged on the same layer as the source electrode 1125 and the drain electrode 1126 of the thin film transistor (that is, is also located in the first display metal layer 1127), whereby the first capacitance electrode and the second capacitance electrode adopt the fourth insulation layer 11210 as a dielectric material to form the storage capacitor.

For example, in some examples of the present disclosure, as shown in FIG. 3, the display substrate may further include an encapsulation layer 1150 arranged on the light-emitting element 1140. The encapsulation layer 1150 seals the light-emitting element 1140, so that degradation of the light-emitting element 1140 caused by moisture and/or oxygen included in the environment may be reduced or avoided. The encapsulation layer 1150 may be a single-layer structure or a composite layer structure, and the composite layer structure includes a structure in which inorganic layers and organic layers are stacked. For example, the encapsulation layer 1150 may include a first inorganic encapsulation layer 1151, a first organic encapsulation layer 1152, and a second inorganic encapsulation layer 1153 which are sequentially arranged. The encapsulation layer 1150 may extend to the bonding region, and in the above example, the encapsulation layer does not cover the plurality of contact pads.

For example, the material of the encapsulation layer may include insulation materials, such as silicon nitride, silicon oxide, silicon oxynitride, polymer resin, etc. Inorganic materials, such as silicon nitride, silicon oxide, and silicon oxynitride have high compactness and can prevent invasion of water, oxygen, etc. The material of the organic encapsulation layer may be a polymer material containing a desiccant or a polymer material configured to block water vapor, for example, a polymer resin or the like to planarize the surface of the display substrate, and to relieve the stress of the first inorganic encapsulation layer and the second inorganic encapsulation layer. The material of the organic encapsulation layer may further include a water absorbent material, such as a desiccant to absorb substances such as water and oxygen invading the interior of the display substrate.

For example, in some examples of the present disclosure, the barrier dam of the dam region 1102 may be arranged on the same layer as one layer or more layers of the first planarization layer, the second planarization layer, and the pixel defining layer, thereby preventing the organic layer in the encapsulation layer from overflowing. The material of the barrier dam may include organic insulation materials. The organic insulation materials can be polymer materials containing desiccant or polymer materials that can block water vapor, such as polymer resin.

For example, in some examples of the present disclosure, as shown in FIG. 3, the display substrate also includes a fifth insulation layer 11110, an auxiliary conductive electrode 11120, and a display region protective layer 11130. The fifth insulation layer 11110 is arranged on the encapsulation layer 1150 to cover the encapsulation layer 1150. In the embodiments of the present disclosure, the fifth insulation layer 11110 is not necessary, and in other embodiments, the fifth insulation layer 11110 may also be removed to reduce the thickness of the display substrate. The auxiliary electrode 11120 is arranged on the side of the fifth insulation layer 11110 away from the base substrate. The auxiliary electrode 11120 can be used for other auxiliary functions, such as a touch control function, and has an opening on one pixel structure 1110. The display region protective layer 11130 is arranged on the side of the auxiliary electrode 11120 away from the base substrate to protect the auxiliary electrode 11120. The display region protective layer 11130 is arranged on the same layer as the third insulation layer 1333.

For example, the material of the fifth insulation layer 11110 may include organic insulation materials, such as polyimide, phthalimide, phthalamide, acrylic resin, benzocyclobutene or phenolic resin, etc., or inorganic insulation materials, such as silicon oxide and silicon nitride, the embodiments of the present disclosure are not limited to this case.

For example, the auxiliary electrode layer for realizing the touch function may be used to realize a capacitive touch structure, which is a self-capacitance type or a mutual capacitance type. The touch structure of the self-capacitance type includes a plurality of self-capacitance electrodes arranged in an array (at the same layer), and each of the plurality of self-capacitance electrodes is electrically connected to a touch processing circuit (such as a touch chip) through a touch lead wire. Position detection is realized by detecting a capacitance change of the plurality of capacitance electrodes due to, for example, finger proximity during touch. The touch structure of the mutual capacitance type includes a plurality of first touch signal lines extending in a first direction and a plurality of second touch signal lines extending in a second direction, and the plurality of first touch signal lines and the plurality of second touch control signal lines are electrically connected to a touch processing circuit (such as a touch chip) through touch lead wires. The first direction and the second direction cross each other and form an opening, thereby forming a touch capacitance at one of crossing positions of the plurality of first touch signal lines and the plurality of the second touch signal lines, and realizing position detection by detecting a capacitance change in the touch capacitance due to, for example, finger proximity during touch. The embodiments of the present disclosure are illustrated by taking the touch structure of the mutual capacitance type as an example.

As shown in FIG. 3, the mutual capacitance type of the touch structure includes excitation electrodes and induction electrodes which are mutually crossed and arranged at the same layer to realize the touch function of the display substrate. For example, the induction electrode includes a plurality of segments, and the excitation electrode is continuous. At the position where the excitation electrode and the induction electrode cross with each other, bridge electrodes (not shown) located in different layers with the induction electrode and the excitation electrode are provided to electrically connect two adjacent segments of the induction electrode with each other. The touch sensitivity of the display substrate may be improved by arranging the induction electrode and the excitation electrode. The auxiliary electrode 11120 is arranged on the same layer as the third conductive pattern 13113. The third conductive pattern 13113 may be made of the same material as one of the induction electrode and the excitation electrode, and formed by the same patterning process.

For example, the material for forming the auxiliary electrode layer 11120 may include indium tin oxide (ITO), thereby obtaining a transparent electrode, or the material for forming the auxiliary electrode layer 11120 may include a metal mesh, thereby also obtaining a transparent electrode. For example, the auxiliary electrode 11120 may be used as a touch electrode in other embodiments.

At least one embodiment of the present disclosure also provides a display substrate, which includes a base substrate, lead wires, a plurality of contact pads, a first insulation laminated layer, and a second insulation laminated layer. The base substrate includes a display region and a display peripheral region at least partially surrounding the display region, where the display peripheral region includes a first bonding region on a side of the display region, a bonding boundary region, and a bonding peripheral region; the lead wires are located in the first bonding region; the plurality of contact pads are located in the first bonding region, the plurality of contact pads includes at least two conductive patterns, the plurality of contact pads on a side of the lead wires away from the base substrate and electrically connected to the lead wires; the first insulation laminated layer are located in the bonding boundary region; the second insulation laminated layer are located in the bonding peripheral region, at least one insulation layer of the second insulation laminated layer extends into the bonding boundary region to obtain a first insulation laminated layer, and at least one insulation layer of the first insulation laminated layer covers one edge of at least two conductive patterns and the edge of at least one insulation layer is covered by the other of at least two conductive patterns.

In the display substrate provided in the above embodiments, the first insulation laminated layer is arranged in the bonding boundary region of the display peripheral region, and at least one edge of the first insulation laminated layer covers one edge of at least two conductive patterns and the edge of at least one insulation layer is covered by the other of at least two conductive patterns, thereby preventing the conductive patterns located a side close to the base substrate from being corroded by etching solution in the process of manufacturing other film layers, preventing the metal in the conductive patterns from falling off and stripping, and being more conducive to completing the bonding process, thereby improving the product yield of the display substrate.

Figure 4A:
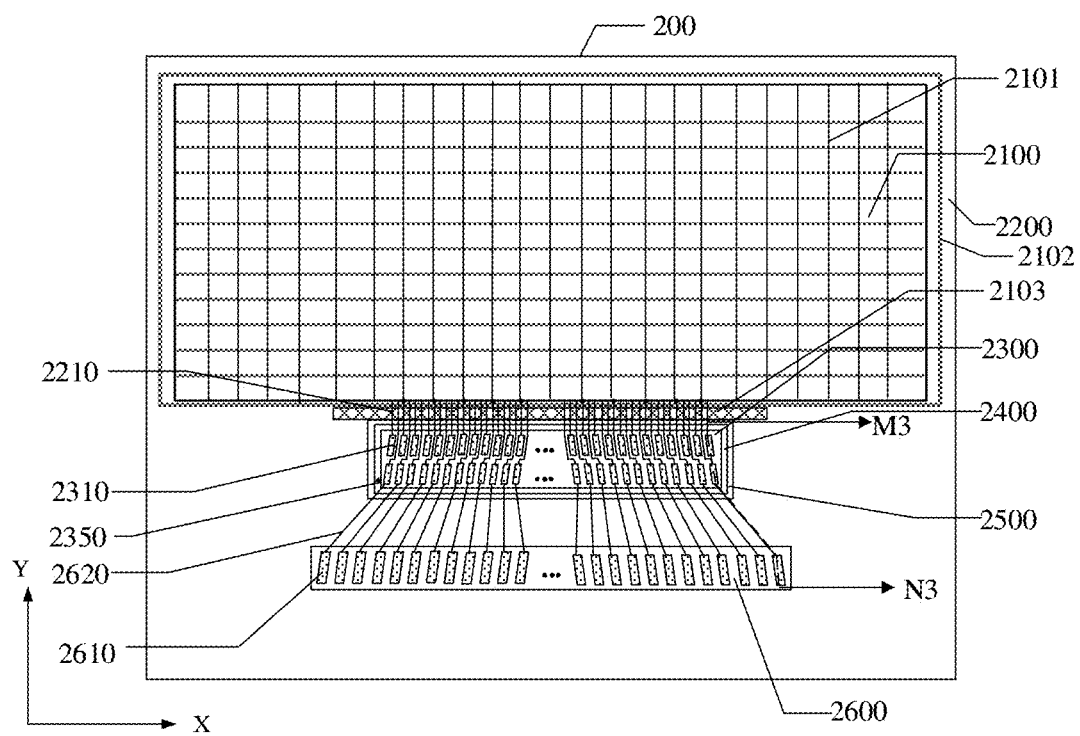
FIG. 4A is a plan view of another display substrate provided by an embodiment of the present disclosure.
Figure 4B:
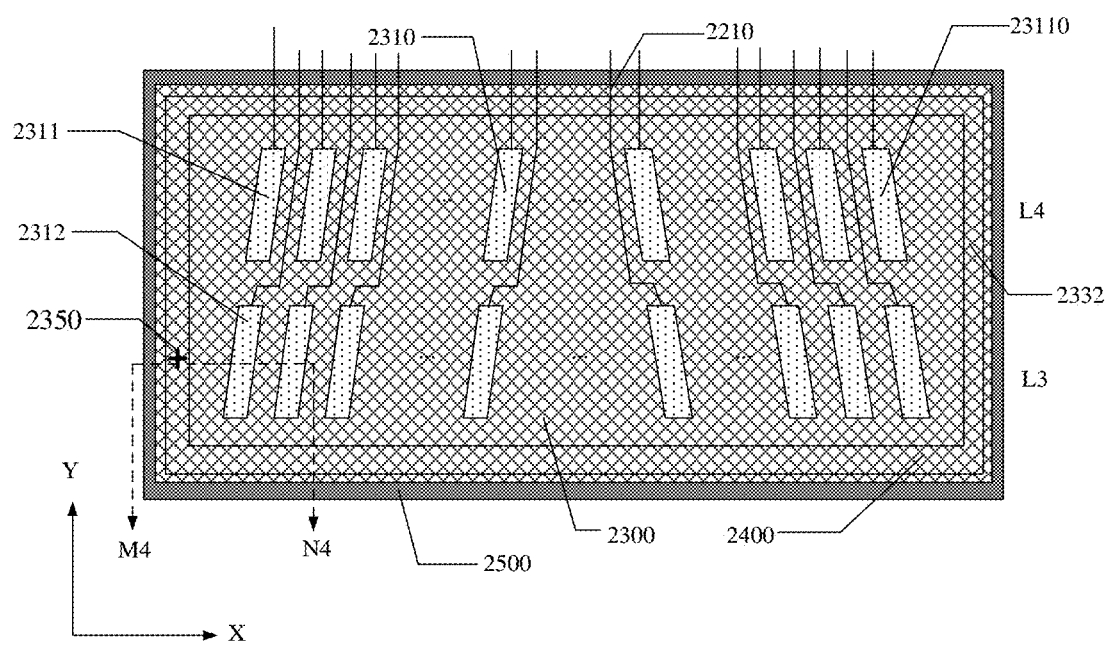
FIG. 4B is a plan view of a first bonding region of another display substrate provided by an embodiment of the present disclosure.

At least one embodiment of the present disclosure provides another display substrate, FIG. 4A a plan view of another display substrate provided by an embodiment of the present disclosure. FIG. 4B is a plan view of a first bonding region of another display substrate provided by an embodiment of the present disclosure. A display substrate is used for, for example, an organic light-emitting diode (OLED) display device or a quantum dot light-emitting diode (QLED) display device.

In the present embodiment, as shown in FIG. 4A, the display region 2100 includes a plurality of sub-pixels and a plurality of signal lines 2101, and the plurality of signal lines 2101 include signal lines (for example, gate lines G) extending in a first direction (X-axis direction in the figure) and signal lines (for example, data lines D) extending in a second direction (Y-axis direction in the figure). These signal lines extend or route to the first bonding region located on at least a side of the display region 2100. For example, the signal lines 2101 are electrically connected to the corresponding lead wires, so that the signal lines 2101 can be electrically connected to the drive chips and flexible printed circuit board which are bonded in the first bonding region. The signal lines 2101 may be provided as scanning lines (gate lines), data lines, power lines, detection lines, etc. which provide control signals, data signals, voltage signals, etc., for the pixel array.

For example, as shown in FIG. 4A and FIG. 4B, the display substrate 200 includes a base substrate including a display region 2100 and a display peripheral region 2200 surrounding the display region 2100. The display peripheral region 2200 includes a dam region 2102 surrounding the display region and a transition region 2103 on a side of the display region 2100. The dam region 2102 includes a barrier dam, and the barrier dam may be formed as one-layer structure or a more-layers structure. The base substrate further includes a first bonding region 2300 and a bonding peripheral region 2500 on a side of the display region 2100. The first bonding region 2300 includes a bonding boundary region 2400. The bonding boundary region 2400 is located between the first bonding region 2300 and the bonding peripheral region 2500. For example, the first bonding region 2300 may use a Chip on Pi technology to bond an integrated circuit chip to a flexible substrate (such as a Pi substrate) of a display substrate. For example, the display peripheral region 2200 further includes a second bonding region 260 located on the side of the first bonding region 2300 away from the display region 2100 using FOP (a flexible printed circuit board on Pi) double-sided bonding process. The figure shows one first bonding region 2300, but the amount of the first bonding regions of the present disclosure is not limited to this case. It should be noted that the detailed structure and film arrangement of the transition region 2103 as shown in FIG. 4A are the same as those of the transition region 1103 as shown in FIG. 1A, which will not be described in detail here.

For example, as shown in FIG. 4A and FIG. 4B, the display substrate 200 may further include a plurality of lead wires 2210 and a plurality of contact pads 2310, and the plurality of contact pads 2310 is arranged on the first bonding region 2300. The plurality of contact pads 2310 includes a plurality of first contact pads 2311 and a plurality of second contact pads 2312. The plurality of first contact pads 2311 are located on a side of the first bonding region 2300 close to the display region, and the plurality of second contact pads 2312 are located on a side of the first bonding region 2300 away from the display region. The plurality of second contact pads 2312 are arranged in at least one row (one row as shown), and the plurality of first contact pads 2311 are arranged in at least one row (one row as shown). Here, the direction of the row is the direction in which the first bonding region 2300 extends facing the display region 2100. The plurality of first contact pads 2311 and the plurality of second contact pads 2312 may also be arranged in a plurality of rows, the embodiments of the present disclosure are not limited to this case. The plurality of lead wires 2210 are electrically connected to the plurality of contact pads 2310 in one-to-one correspondence. One end of one of the plurality of lead wires 2210 extends to the display region 2100 to be electrically connected to a corresponding signal line (for example, data line) in the display region 2100, and the other end of one of the plurality of lead wires 2210 extends to the first bonding region 2300 to be electrically connected to the plurality of contact pads 2310. For example, the plurality of lead wires 2210 are arranged in the same layer as the signal lines in the display region 2100, so that the plurality of lead wires 1210 and the signal lines can be integrally formed or formed in different layers, so that the plurality of lead wires 2210 and the signal lines need to be electrically connected to each other through via holes in the interlayer insulation layer between the plurality of lead wires 2210 and the signal lines.

In an example of the present disclosure, the plurality of first contact pads 2311 and the plurality of second contact pads 2312 are configured to transmit signals of an external circuit, such as display signals, to the plurality of lead wires of the display region.

In an example of the present disclosure, the plurality of third contact pads 2620 are configured to transmit signals of an external circuit, such as display signals, to the plurality of second contact pads in the first bonding region, and then the plurality of second contact pads transmits the signals to the lead wires of the display region.

For example, as shown in FIG. 4A, the display substrate 200 further includes a plurality of second bonding region lead wires 2620 and a plurality of third contact pads 2610. The plurality of second bonding region lead wires 2620 are electrically connected to the plurality of third contact pads 2610 in one-to-one correspondence. One end of plurality of the second bonding region lead wires 2620 extends to the first bonding region 2300 to be electrically connected to the plurality of second contact pads 2312, and the other end of the plurality of second bonding region lead wires 2620 extends to the second bonding region 2600 to be electrically connected to the plurality of third contact pads 2610.

The sectional line M3-N3 in FIG. 4A passes through a first contact pad 2311, a second contact pad 2312 in the first bonding region 2300, and a third contact pad 2610 in the second bonding region 2600 to show a film change relationship between the first bonding region 2300 and the second bonding region 2600.

For example, as shown in FIG. 4B, in the first bonding region 2300, there are gaps between the plurality of first contact pads 2311 in the same row or between the plurality of second contact pads 2312 in the same row, and there are also gaps between the plurality of first contact pads 2311 and the plurality of second contact pads 2312. The contact pad 2311 includes a conductive pattern lamination layer 23110. As shown in the figure, the sectional line M4-N4 passes through two second contact pads 2312 located close to the bonding boundary region 2400 in a L3 row, and passes through the bonding boundary region 2400 and the bonding peripheral region 2500 to show the film change relationship among the first bonding region 2300, the bonding boundary region 2400, and the bonding peripheral region 2500.

In some embodiments of the present disclosure, the film change at the sectional line M4-N4 of the first bonding region 2300 is the same as the film change at its symmetrical position, and the case as shown in FIG. 4B is taken as an example for explanation.

For example, as shown in FIG. 4B, the display substrate 100 further includes a first insulation laminated layer 2320 and a second insulation laminated layer 2330. The first insulation laminated layer 2320 is located in the bonding boundary region 2400, and the second insulation laminated layer 2330 is located in the bonding peripheral region 2500. The layer, located on a top layer, of the first insulation laminated layer 2320, extends to the first bonding region 2300, and covers the edges of the plurality of contact pads 2310.

For example, as shown in FIG. 4B, the plurality of lead wires 2210 connected to the plurality of second contact pads 2312 extend through the gaps of the plurality of first contact pads 2311 in a L4 row, and then extend to the display region 2100, so that the plurality of contact pads 2310 has a larger arrangement space and can avoid mutual interference or short circuit with the plurality of lead wires 2210 connected to the plurality of first contact pad 2311 in the L4 row.

In other examples, the plurality of lead wires 2210 may also be located in different layers, for example, a part of the plurality of lead wires 2210 for connecting the plurality of second contact pads 2312 are located in a layer closer to the base substrate, while a part of the plurality of lead wires 2210 for connecting the first contact pads 2311 are located in a layer relatively away from the base substrate 1000 (but still located between the plurality of contact pads and the base substrate). Therefore, space distances between the plurality of lead wires 1210 in the same layer are increased, and the risk of interference and short circuit between the plurality of lead wires is reduced, which is beneficial to forming a display device with high pixel resolution. Furthermore, the plurality of lead wires 2210 in the same layer can be manufactured in the same patterning process, and the plurality of lead wires 2210 in different layers may be manufactured in different patterning processes.

For example, the material of the plurality of lead wires 2210 may include a metal material or an alloy material, such as a metal single-layer structure or a metal multi-layer structure formed by molybdenum, aluminum, titanium, etc.

Figure 5A:
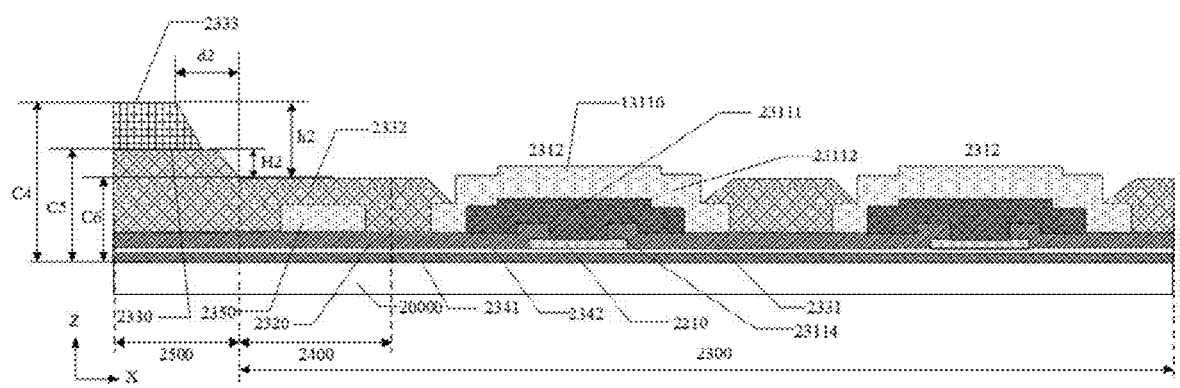
FIG. 5A is a schematic cross-sectional view of the display substrate as shown in FIG. 4B along line M4-N4.

For example, FIG. 5A is a schematic cross-sectional view of the display substrate as shown in FIG. 4B along line M4-N4. As shown in FIG. 5A, a contact pad 2312 is located on the side of a lead wire 2210 away from the base substrate 2000. At least two insulation layers of the second insulation laminated layer 2330 extend into the bonding boundary region 2400 to obtain the first insulation laminated layer 2320. A height C6 of the first insulation laminated layer 2320 relative to the base substrate 2000 is smaller than a height C4 of the second insulation laminated layer 2330 relative to the base substrate 2000. Further, the height of the film layer difference in the bonding peripheral region is reduced, so that the risk of bubble generation in the bonding peripheral region and the bonding boundary region is reduced, and the product yield and reliability of the display substrate are improved.

For example, the base substrate 2000 may be a glass plate, a quartz plate, a metal plate, a resin plate, etc. For example, the material of the base substrate may include an organic material, for example, the organic material may be a resin material, such as polyimide (Pi), polycarbonate, polyacrylate, polyetherimide, polyethersulfone, polyethylene terephthalate, and polyethylene naphthalate, etc., the base substrate 2000 may be a flexible substrate or a non-flexible substrate, and the embodiments of the present disclosure are not limited thereto.

For example, as shown in FIG. 5A, the second insulation laminated layer 2330 includes a first insulation layer 2331 and a second insulation layer 2332 in the bonding peripheral region 2500. The first insulation layer 2331 is located on the base substrate 2000, and the second insulation layer 2332 is located on a side of the first insulation layer 2331 away from the base substrate 2000. The first insulation layer 2331 and the second insulation layer 2332 extend into the bonding boundary region 2400 to obtain the first insulation laminated layer 2320. Relative to with the base substrate 2000, the height C6 of the second insulation layer 2332 in the bonding boundary region 2400 is smaller than a height C5 of the second insulation layer 2332 in the bonding peripheral region 2500, that is, the second insulation layer 2332 is integrally arranged in the bonding boundary region 2400 and the bonding peripheral region 2500, but has different heights. As shown in the figure, the parts of the second insulation layer 2332 with different heights can be continuously transitioned, for example, the second insulation layer 2332 has a slope angle with respect to the base substrate, which is about 40 degrees to 60 degrees, and for example, is about 50 degrees. It should be noted that the height of the second insulation layer 2332 refers to the vertical distance from the surface of the second insulation layer 2332 to the surface of the base substrate 2000. The film thickness of the second insulation layer 2332 in the bonding boundary region 2400, that is, the vertical distance between the upper surface and the lower surface of the second insulation layer 2332, can range from about 1.0 microns to 1.4 microns, for example, the vertical distance can be about 1.2 microns. The film thickness of the second insulation layer 2332 in the bonding peripheral region 2500 can range from about 1.8 microns to 2.2 microns, for example, and the value of the film thickness can be about 2 microns. Therefore, the height difference H2 between the height C2 of the second insulation layer 2332 in the bonding peripheral region 2500 and the height H2 of the second insulation layer 2332 in the bonding boundary region 2400 can range from about 0.4 microns to 1.2 microns, or for example, the value of the height difference H2 can be about 0.8 microns. The height difference between the film layers in the bonding peripheral region and the film layers in the bonding boundary region, that is, the film layer segment difference, is reduced, so that the risk of bubble generation in the bonding peripheral region and the bonding boundary region is reduced, and the product yield and reliability of the display substrate is improved.

In the embodiments of the present disclosure, the word "about" indicates the variation range of a given numerical value, which is within 15% of the numerical value, for example, within 5% of the numerical value, or within 10% of the numerical value, etc.

For example, the material of the first insulation layer 2331 may include inorganic insulation materials, such as silicon oxide, silicon nitride, silicon oxynitride, etc., or organic insulation materials, such as polyimide (Pi), phthalimide, phthalamide, acrylic resin, benzocyclobutene, or phenolic resin, etc. The embodiments of the present disclosure are not specifically limited to the material of the first insulation layer. The material of the second insulation layer 2332 may include inorganic insulation materials, such as silicon oxide, silicon nitride, silicon oxynitride, etc., or organic insulation materials, such as polyimide, phthalimide, phthalamide, acrylic resin, benzocyclobutene, or phenolic resin, etc. The embodiments of the present disclosure are not specifically limited to the material of the second insulation layer.

For example, as shown in FIG. 5A, at least two insulation layers of the second insulation laminated layer 2330 further include a third insulation layer 2333. The third insulation layer 2333 is located on a side of the second insulation layer 2332 away from the base substrate 2000 and is configured to expose the second insulation layer 2332 on a side close to the plurality of contact pads 2310. The edge of the third insulation layer 2333 close to the bonding boundary region 2320 has a slope angle, and the edge is not aligned with the edge with a slope angle on a side of the second insulation layer 2332 close to the bonding boundary region 2320 at the bonding peripheral region 2330. The distance between an edge of the side of the third insulation layer 2333 and the bonding boundary region 2320 is greater than the distance between an edge of the side of the second insulation layer 2332 and the bonding boundary region 2320. The larger the distance between the third insulation layer and the bonding boundary region, the more beneficial it will be to reduce the risk of bubble generation in the bonding process. In addition, the third insulation layer 2333 can also protect the surrounding lead wires. The film thickness of the third insulation layer 2333 may be about 3 microns. The height difference H2 between the height C5 of the second insulation layer 2332 in the bonding peripheral region 2500 and the height of the second insulation layer 2332 in the bonding boundary region 2400 plus the thickness of the third insulation layer 2333 is the difference h2 between the height C4 of the second insulation laminated layer 2330 from the base substrate 2000 and the height C6 of the first insulation laminated layer 2320 from the base substrate 2000, and the difference h2 can range from about 3.4 microns to 4.2 microns, for another example the value of the difference h2 can be about 3.8 microns. On the other hand, in the direction parallel to the base substrate 2000, the distance d2 obtained by projecting the difference h2 on the base substrate ranges from about 100 microns to 200 microns.

For example, the material of the third insulation layer 2333 may include organic insulation materials. The organic insulation materials can be polymer materials containing desiccant or polymer materials that can block water vapor, such as polymer resin, etc.

For example, continue as shown in FIG. 5A, the display substrate 200 further includes a bonding region buffer layer 2341 located above the base substrate 2000 and a bonding region gate insulation layer 2342 located on a side of the bonding region buffer layer 2341 away from the base substrate 2000. A lead wire 2210 is located on the bonding region gate insulation layer 2342. One end of the lead wire 2210 is electrically connected to the contact pad 2310. The first insulation layer 2331 extends to the first bonding region between the contact pad 2310 and the lead wire 2210.

For example, the conductive pattern lamination layer of the plurality of contact pads includes at least two conductive patterns, and at least one insulation layer of the first insulation laminated layer covers an edge of one of the at least two conductive patterns and an edge of the at least one insulation layer is covered by the other of the at least two conductive patterns.

For example, as shown in FIG. 5A, the conductive pattern lamination layer 23110 includes a first conductive pattern 23111 and a second conductive pattern 23112. The first conductive pattern 23111 is located on a side of the lead wire 2210 away from the base substrate 2000 and is electrically connected to the lead wire 2210. The second conductive pattern 23112 is located on a side of the first conductive pattern 23111 away from the substrate 2000 and covers an edge of the first conductive pattern 23111 to avoid the first conductive pattern 23111 being corroded by etching solution. The first insulation layer 2331 is located between the first conductive pattern 23111 and the lead wire 2210, so that the first conductive pattern 23111 is electrically insulated from the lead wire 2210. A first conductive pattern via hole 23114 is formed in the first insulation layer 2331. The first conductive pattern 23111 and the lead 2331 are electrically connected through the first conductive pattern via hole 23114. The second insulation layer 2332 in the first insulation laminated layer 2320 extends to the first bonding region to cover the edge of the second conductive pattern 23112, so as to prevent the second conductive pattern 23112 from being corroded. The second conductive pattern 23112 is configured to be exposed relative to the first insulation laminated layer 2320 for being electrically connected to an external circuit.

For example, the material of the first conductive pattern 23111 may include a metal material or an alloy material, such as a metal single-layer structure or a metal multi-layer structure formed by molybdenum, aluminum, titanium, etc. The material of the second conductive pattern 23112 may include a metal material or an alloy material, such as a metal single-layer structure or a metal multi-layer structure formed by molybdenum, aluminum, titanium, etc.

For example, as shown in FIG. 4A, FIG. 4B and FIG. 5A, the bonding boundary region 2400 further includes a marking metal layer 2350 between the first insulation layer 2331 and the second insulation layer 2332, which is configured to align an external circuit during the bonding process. The marking metal layer 2350 may be arranged in the same layer as the first conductive pattern 23111 or the second conductive pattern 23112. The embodiments of the present disclosure have no restrictions on the planar pattern of the marking metal layer, and may be, for example, a cross shape, a square shape, a rectangle shape, etc.

For example, in some example of the present disclosure, the plurality of third contact pads in the second bonding region include a plurality of contact pad metal layers. The plurality of contact pad metal layers include a first contact pad metal layer and a second contact pad metal layer, the first contact pad metal layer is provided on a side of the first insulation layer away from the base substrate, and the second contact pad metal layer is laminated with the first contact pad metal layer and covers a periphery of the second contact pad metal layer. Here, the first contact pad metal layer is provided at the same layer as the first conductive pattern layer, and the second contact pad metal layer is provided at the same layer as the second conductive pattern layer.

For example, in some example of the present disclosure, the second contact pad metal layer extends toward the first bonding region to form the second bonding region lead wires, and the second insulation layer extends to the second bonding region and covers the second bonding region lead wires and an edge of the second contact pad metal layer.

For example, in some example of the present disclosure, a thickness of a part of the second insulation layer located between the first bonding region and the second bonding region along the direction perpendicular to the base substrate is substantially the same as a thickness of a part of the second insulation layer located in the first bonding region along the direction perpendicular to the base substrate, and an orthographic projection of the part of the second insulation layer between the first bonding region and the second bonding region on the base substrate at least partially overlaps with an orthographic projection of the second bonding region lead wires on the base substrate.

Figure 5B:
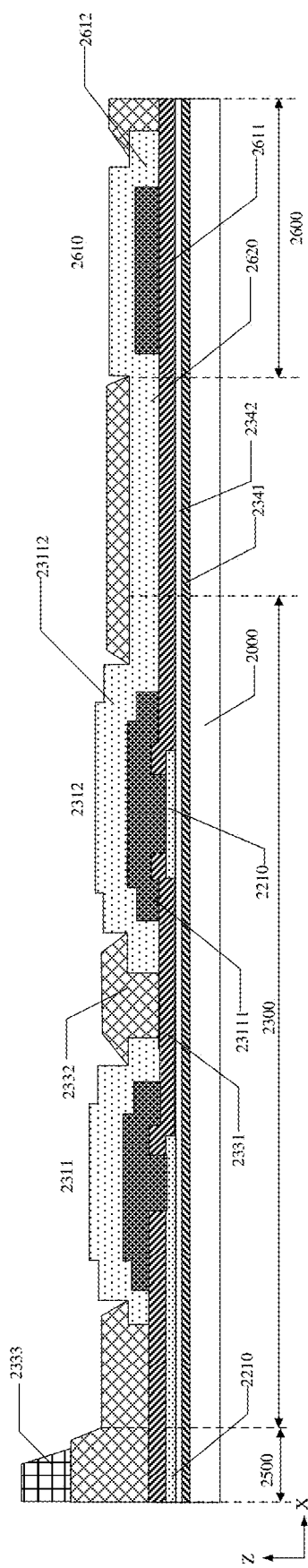
FIG. 5B a schematic cross-sectional view of the display substrate as shown in FIG. 4A along line M3-N3.

For example, in some example of the present disclosure, FIG. 5B is a schematic cross-sectional view of the display substrate as shown in FIG. 4A along line M1-N1. As shown in FIG. 5B, the bonding region buffer layer 2341 and the bonding region gate insulation layer 2342 further extend to the second bonding region 2600. A lead wire 2210 connecting a first contact pad 2311 further extends to the bonding boundary region 2500. The film laminated layer in the bonding boundary region 2500 includes a lead wire 2210, a first insulation layer 2331, a second insulation layer 2332, and a third insulation layer 2333. The thickness of the second insulation layer 2332 in the bonding peripheral region is greater than the thickness of the second insulation layer 2332 in the first bonding region, and the difference of thicknesses of the second insulation layer 2332 is approximately the same as the value of the height difference H2 as shown in FIG. 5A. A third contact pad 2610 includes a first contact pad metal layer 2611, a second contact pad metal layer 2612. The first contact pad metal layer 2611 is located on the bonding region gate insulation layer 2342, and the first contact pad metal layer 2611 and the first conductive pattern 23111 are arranged on the same layer, so that the first contact pad metal layer 2611 and the first conductive pattern 23111 can be manufactured by the same patterning process to simplify the process flow. The second contact pad metal layer 2612 is located on a side of the first contact pad metal layer 2611 away from the base substrate and covers the edge of the first contact pad metal layer 2611 to prevent the first contact pad metal layer 2611 from being corroded by etching solution. A second bonding region lead wire 2620 covers the space between the edge of the first contact metal layer 2611 close to the first bonding region 2300 and the edge of the second conductive pattern 23112 close to the second bonding region 2600. The second contact pad metal layer 2612 extends toward the first bonding region 2300 to form a second bonding region lead wire 2620. The second insulation layer 2332 extends to the second bonding region 2600 and covers the edge of the second bonding region lead wire 2620 and the second contact pad metal layer 2612. In addition, the second contact pad metal layer 2612 and the second conductive pattern 23112 are arranged on the same layer, so that the second contact pad metal layer 2612 and the second conductive pattern 23112 can be manufactured by the same patterning process to simplify the process flow. The second insulation layer 2332 located between the first bonding region 2300 and the second bonding region 2600 is located on the side of the second conductive pattern 23112 away from the base substrate 2000, and extends to the second bonding region 2600 and covers the edge of the second contact pad metal layer 2612 to avoid corrosion of the second contact pad metal layer 2612. The second contact pad metal layer 2612 is configured to be exposed relative to the second insulation layer 2332 for being electrically connected to an external circuit.

In the embodiments of the present disclosure, "arrangement in the same layer" means that two functional layers (for example, the first contact pad metal layer and the first conductive pattern) are formed on the same layer and of the same material in the hierarchical structure of the display substrate, that is, in the manufacturing process, the two structural layers can be formed by the same material layer, and the required patterns and structures can be formed by the same patterning process. For example, the material layer can be formed at first and then the required patterns and structures may be formed by the patterning process with the material layer. Or, in the manufacturing process, the two structural layers may be formed by the same material layer, but the required patterns and structures are formed by different patterning processes. Or, in the manufacturing process, the two structural layers are located on the same layer, and the two structural layers can be formed of different material layers, and the required patterns and structures are formed by the same patterning process.

For example, in some examples of the present disclosure, the sub-pixel of each pixel unit in the pixel array of the display region of the display substrate may also include a pixel structure. The pixel structure includes a pixel drive circuit, a first planarization layer, a first transfer electrode, a second planarization layer, and a light-emitting element. The first planarization layer is on a side of the pixel drive circuit away from the base substrate to provide a first planarization surface and includes a first via hole, the first transfer electrode is located on the first planarization surface and is electrically connected to the pixel drive circuit through the first via hole. The second planarization layer is located on a side of the first transfer electrode away from the base substrate to provide a second planarization surface and includes a second via hole. The light-emitting element is located on the second planarization surface and is electrically connected to the first transfer electrode through the second via hole. The second planarization layer is provided at the same layer as the second insulation layer, so that the manufacturing process of the display substrate is simplified, and the cost of products is reduced.

For example, the pixel drive circuit may include a thin film transistor, a storage capacitor, etc., may be implemented in various types, such as a 2T1C type (that is, including two thin film transistors and one storage capacitor), and may further include more transistors and/or capacitors based on the 2T1C type to have functions of compensation, reset, light-emitting control, detection, etc. The embodiments of the present disclosure are not limited to the type of the pixel drive circuit. For example, in some embodiments, the thin film transistor directly and electrically connected to the light-emitting element may be a drive transistor, or a light-emitting control transistor, etc.

Figure 6:
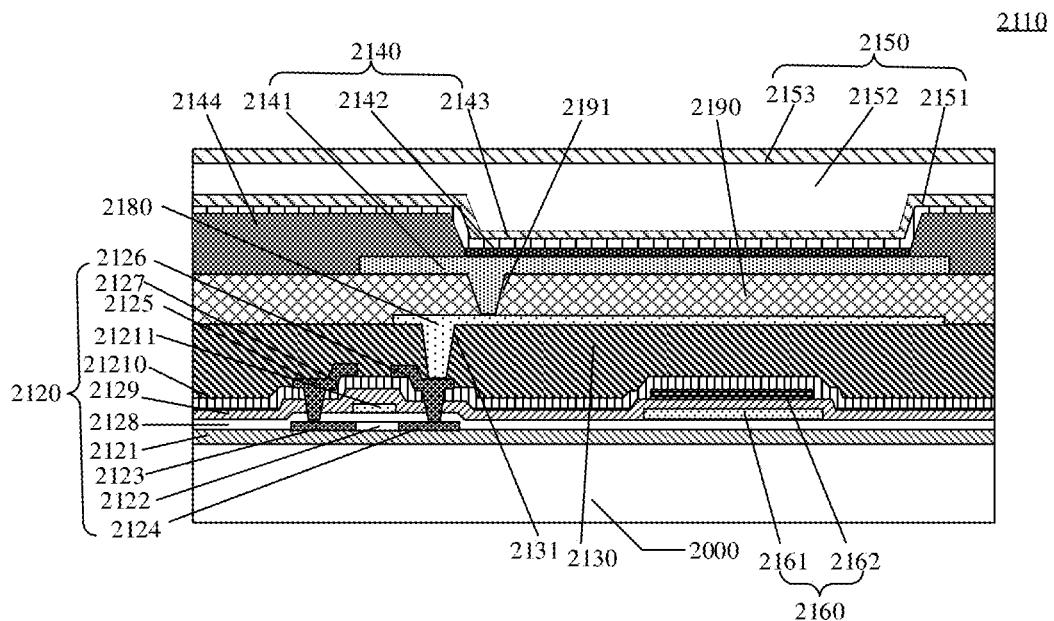
FIG. 6 is a schematic cross-sectional view of the display region of the display substrate as shown in FIG. 4A.

For example, in some examples of the present disclosure, FIG. 6 is a schematic cross-sectional view of the display region of the display substrate as shown in FIG. 4A. As shown in FIG. 6, sub-pixels of the display region of the display substrate 200 may also include a pixel structure 2110 for driving and controlling light emission. The pixel structure 2110 includes a pixel drive circuit 2120, a first planarization layer 2130, a first transfer electrode 2180, a second planarization layer 2190, and a light-emitting element 2140.

For example, the pixel structure 2110 also includes a buffer layer 2121 on the base substrate 2000. The pixel drive circuit 2120 may include an active layer 2122 on the buffer layer 2121, a gate insulation layer 2128 on a side of the active layer 2122 away from the substrate 2000, a gate electrode 21211 on the gate insulation layer 2128, an interlayer insulation layer 2129 located on a side of the gate electrode 21211 away from the base substrate 2000 and on a side of a source electrode and a drain electrode (a source electrode 2125 and a drain electrode 2126 in FIG. 6) close to the base substrate 2000, a fourth insulation layer (another interlayer insulation layer) 21210 located on the interlayer insulation layer 2129, and a source electrode 2125 and drain electrode 2126 located on the fourth insulation layer 21210. The gate electrode 21211 may be arranged in the same layer as the plurality of lead wires 2210 in the first bonding region 2300. Therefore, the gate electrode 21211 and the plurality of lead wires 2210 can be formed on the same layer in the manufacturing process, for example, by using the same material layer through the patterning process. The interlayer insulation layer 2129 may be arranged in the same layer as the first insulation layer 2331, so that the interlayer insulation layer 2129 and the first insulation layer 2331 can be formed on the same layer in the manufacturing process, for example, by using the same material layer through the patterning process. The buffer layer 2121 in the display region is arranged on the same layer as the bonding buffer layer 2341, and the buffer layer 2121 and the bonding buffer layer 2341 can be formed on the same layer in the manufacturing process. The gate insulation layer 2128 in the display region is arranged on the same layer as the bonding region gate insulation layer 2342, and the gate insulation layer 2128 and the bonding region gate insulation layer 2342 can be formed on the same layer in the manufacturing process. As a transition layer, the buffer layer 2121 can prevent harmful substances in the base substrate from intruding into the display substrate and increase the adhesion of the film layer in the display substrate 200 to the base substrate 2000.

For example, the material of the buffer layer 2121 may include insulation materials such as silicon oxide, silicon nitride, and silicon oxynitride, etc. Material of one of or materials of more of the fourth insulation layer 21210, the interlayer insulation layer 2129, and the gate insulation layer 2128 may include insulation materials, such as silicon oxide, silicon nitride, and silicon oxynitride, etc. The materials of the fourth insulation layer 21210, the interlayer insulation layer 2129 and the gate insulation layer 2128 may be the same or different.

For example, as shown in FIG. 6, the active layer 2122 may include a source region 2123, a drain region 2124, and a channel region located between the source region 2123 and the drain region 2124. The fourth insulation layer 21210, the interlayer insulation layer 2129 and the gate insulation layer 2128 have vias that is arranged to expose the source region 2123 and the drain region 2124. The source electrode 2125 and the drain electrode 2126 are electrically connected to the source region 2123 and the drain region 2124 through vias, respectively. The gate electrode 21211 overlaps with the channel region between the source region 2123 and the drain region 2124 in the active layer 2122 in the direction perpendicular to the base substrate 2000. The first planarization layer 2130 is located above the source electrode 2125 and the drain electrode 2126 for planarizing the surface of the pixel drive circuit on the side away from the base substrate. The first planarization layer 2130 can planarize that uneven surface caused by the pixel drive circuit, and thus prevent irregularities caused by the pixel drive circuit from cause defects in the light-emitting device. A first via hole 2131 is formed in the first planarization layer 2130 to expose the source electrode 2125 or the drain electrode 2126 (as shown in the figure), and the first transfer electrode 2180 is formed on the first planarization layer 2130. The first transfer electrode 2180 is electrically connected to the drain electrode 2126 through the first via hole 2131, and the transfer electrode 2180 can avoid directly forming a through via with a relatively large aperture in the first planarization layer and a second planarization layer, thereby improving the electrical connection quality of the via. At the same time, the first transfer electrode can also be formed on the same layer as other signal lines (such as power lines, etc.), thus not causing an increase in process steps. The first transfer electrode 2180 is arranged on the same layer as the second conductive pattern 23112 of the plurality of contact pads 2310. Therefore, the first transfer electrode 2180 and the second conductive pattern 23112 can be formed on the same layer in the manufacturing process, for example, by using the same material layer through the patterning process, thus simplifying the manufacturing process.

For example, the material of the first transfer electrode 2180 may include a metal material or an alloy material, such as a metal single-layer structure or a metal multi-layer structure formed by molybdenum, aluminum, titanium, etc.

For example, the material of the active layer 2122 may include polysilicon or an oxide semiconductor (for example, indium gallium zinc oxide). The material of the gate electrode 21211 may include a metal material or an alloy material, such as a metal single-layer or a multi-layer structure formed by molybdenum, aluminum, titanium, etc., for example, the multi-layer structure is a multi-metal laminated layer (such as a three-layer metal laminated layer of titanium, aluminum, and titanium (Ti/Al/Ti). The material of the source electrode 2125 and the drain electrode 2126 may include a metal material or an alloy material, for example, a metal single-layer or a multi-layer structure formed by molybdenum, aluminum, titanium, etc., for example, the multi-layer structure is a multi-metal laminated layer (for example, a three-layer metal laminated layer of titanium, aluminum, and titanium (Ti/Al/Ti)). The embodiments of the present disclosure are not specifically limited to the material of each functional layer.

For example, in some examples of the present disclosure, as shown in FIG. 6, the pixel drive circuit 2120 may further include a first display metal layer 2127, and the first display metal layer 2127 is arranged on the same layer as the first conductive pattern 23111. The first display metal layer 2127 includes the source electrode 2125 and the drain electrode 2126 of the thin film transistor in the pixel drive circuit. The source electrode 2125 and the drain electrode 2126 are arranged on the same layer as the first conductive pattern 23111. Therefore, the source electrode 2125, the drain electrode 2126, and the first conductive pattern 23111 can be formed on the same layer in the manufacturing process, for example, by using the same material layer through patterning process, thereby simplifying the manufacturing process and reducing the manufacturing cost of products.

For example, in some examples of the present disclosure, as shown in FIG. 6, the second planarization layer 2190 is arranged on the side of the first transfer electrode 2180 away from the base substrate 2000 to provide a planarization surface on the side of the first transfer electrode 2180 away from the base substrate 2000. In addition, a second via hole 2191 is formed in the second planarization layer 2190. The second planarization layer 2190 is arranged on the same layer as the second insulation layer 2332, so that the second planarization layer 2190 and the second insulation layer 2332 can be formed on the same layer in the manufacturing process, for example, by using the same material layer through manufacturing process, thus simplifying the manufacturing process.

For example, continue as shown in FIG. 6, the light-emitting element 2140 is formed on the second planarization layer, that is, the light-emitting element 2140 is arranged on the side of the second planarization layer 2190 away from the base substrate. The light-emitting element 2140 includes a first electrode 2141, a light-emitting layer 2142, and a second electrode 2143. The first electrode 2141 of the light-emitting element is electrically connected to the drain electrode 2126 through the first via hole 2131 in the first planarization layer 2130. A pixel defining layer 2144 is formed on the first electrode 2141, and the pixel defining layer 2144 includes a plurality of openings to define a plurality of pixel units. Each of the plurality of openings exposes the first electrode 2141, and the light-emitting layer 2142 is arranged in the plurality of openings of the pixel defining layer 2144. The second electrode 2143 may be arranged, for example, in a part of or the whole of the display region, so that the second electrode 2143 may be formed on the whole surface in the manufacturing process.

For example, the first electrode 2141 may include a reflective layer, and the second electrode 2143 may include a transparent layer or a translucent layer. Thus, the first electrode 2141 may reflect light emitted from the light-emitting layer 2142, and the part of light is emitted into the external environment through the second electrode 2143, so that light emission rate may be provided. In the case where the second electrode 2143 includes a semi-transmissive layer, some light reflected by the first electrode 2141 is reflected again by the second electrode 2143, so that the first electrode 2141 and the second electrode 2143 form a resonant structure, thereby improving light emission efficiency.

For example, the material of the first electrode 2141 may include at least one transparent conductive oxide material, which includes indium tin oxide (ITO), indium zinc oxide (IZO), zinc oxide (ZnO), etc. In addition, the first electrode 2141 may adopt a metal having high reflectivity as a reflective layer, such as silver (Ag).

For example, for OLED, the light-emitting layer 2142 may adopt a small molecular organic material or a polymer molecular organic material, which may be a fluorescent light-emitting material or a phosphorescent light-emitting material, and may emit red light, green light, blue light, or white light. In addition, the light-emitting layer may further include functional layers such as an electron injection layer, an electron transport layer, a hole injection layer, a hole transport layer, and the like as required. For QLED, the light-emitting layer may adopt a quantum dot material, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc., and the particle size of the quantum dots range from 2 nm to 20 nm.

For example, the second electrode 2143 may adopt various conductive materials. For example, the second electrode 2143 may adopt a metal material such as lithium (Li), aluminum (Al), magnesium (Mg), silver (Ag), etc.

For example, the material of the pixel defining layer 2144 may include organic insulation materials, such as polyimide, polyphthalimide, polyphthalamide, acrylic resin, benzocyclobutene or phenolic resin, etc., or inorganic insulation materials, such as silicon oxide, silicon nitride, etc., and the embodiments of the present disclosure are not limited thereto.

For example, continue as shown in FIG. 6, in at least one example of the present disclosure, the display substrate may further include an encapsulation layer 2150 arranged on the light-emitting element 2140. The encapsulation layer 2150 seals the light-emitting element 2140, so that degradation of the light-emitting element 2140 caused by moisture and/or oxygen included in the environment may be reduced or avoided. The encapsulation layer 2150 may be a single-layer structure or a composite layer structure, and the composite layer structure includes a structure in which inorganic layers and organic layers are stacked. For example, the encapsulation layer 2150 may include a first inorganic encapsulation layer 2151, a first organic encapsulation layer 2152, and a second inorganic encapsulation layer 2153 which are sequentially arranged. The encapsulation layer 2150 may extend to the bonding region, and in the above example, the encapsulation layer does not cover the plurality of contact pads. One layer of the encapsulation layer 2150 is disposed in the same layer as the third insulation layer 2333 in the bonding peripheral region 2500. One layer of the encapsulation layer 2150 and the third insulation layer 2333 can be formed by the same patterning process.

For example, the material of the encapsulation layer may include insulation materials, such as silicon nitride, silicon oxide, silicon oxynitride, polymer resin, etc. Inorganic materials, such as silicon nitride, silicon oxide, and silicon oxynitride have high compactness and can prevent invasion of water, oxygen, etc. The material of the organic encapsulation layer may be a polymer material containing a desiccant or a polymer material configured to block water vapor, for example, a polymer resin or the like to planarize the surface of the display substrate, and to relieve the stress of the first inorganic encapsulation layer and the second inorganic encapsulation layer. The material of the organic encapsulation layer may further include a water absorbent material, such as a desiccant to absorb substances such as water and oxygen invading the interior of the display substrate.

For example, in some examples of the present disclosure, the barrier dam of the dam region 2102 may be arranged on the same layer as one layer or more layers of the first planarization layer, the second planarization layer, and the pixel defining layer, thereby preventing the organic layer in the encapsulation layer from overflowing. The material of the barrier dam may include organic insulation materials. The organic insulation materials can be polymer materials containing desiccant or polymer materials that can block water vapor, such as polymer resin.

For example, as shown in FIG. 6, the display substrate 200 further includes a storage capacitor 2160, which may include a first capacitance electrode 2161 and a second capacitance electrode 2162. The first capacitor electrode 2161 is arranged between the gate insulation layer 2128 and the interlayer insulation layer 2129, and the second capacitor electrode 2162 is arranged between the interlayer insulation layer 2129 and the fourth insulation layer 21210. The first capacitor electrode 2161 and the second capacitor electrode 2162 are stacked, and are at least partially overlapped with each other in the direction perpendicular to the base substrate 2000. The first capacitor electrode 2161 and the second capacitor electrode 2162 adopt the interlayer insulation layer 2129 as a dielectric material to form the storage capacitor. The first storage capacitor electrode 2161 is arranged on the same layer as the gate electrode 21211 in the pixel drive circuit 2120 and the plurality of lead wires 2210 in the first bonding region 1300. Therefore, the first storage capacitor electrode 2161, the gate electrode 21211, and the plurality of lead wires 2210 can be formed on the same layer in the manufacturing process, for example, by using the same material layer through patterning process, thereby simplifying the manufacturing process and reducing the manufacturing cost of products.

In another example, as a variation of the example shown in FIG. 6, the first capacitance electrode of the storage capacitor is still arranged on the same layer as the gate electrode 21211, while the second capacitance electrode of the storage capacitor is arranged on the same layer as the source electrode 2125 and the drain electrode 2126 of the thin film transistor (that is, also located in the first display metal layer 2127), whereby the first capacitance electrode and the second capacitance electrode adopt a stack of the interlayer insulation layer 2129 and the fourth insulation layer 21210 as dielectric materials to form the storage capacitor.

In still another example, as a variation of the example shown in FIG. 6, the first capacitance electrode of the storage capacitor is no longer arranged on the same layer as the gate electrode 21211, but is located between the interlayer insulation layer 2129 and the fourth insulation layer 21210, while the second capacitance electrode of the storage capacitor is arranged on the same layer as the source electrode 2125 and the drain electrode 2126 of the thin film transistor (that is, is also located in the first display metal layer 2127), whereby the first capacitance electrode and the second capacitance electrode adopt the fourth insulation layer 21210 as a dielectric material to form the storage capacitor.

It should be noted that, the structure of the display substrate as shown in FIG. 6 is different from the structure of the display substrate as shown in FIG. 3, in that the fifth insulation layer 11110, the auxiliary electrode 11120 and the display region protective layer 11130 are no longer provided in the display substrate as shown in FIG. 6, that is, the display substrate as shown in FIG. 6 does not have a touch function. But the display substrate as shown in FIG. 6 can also provide a touch function according to requirements.

Figure 7:
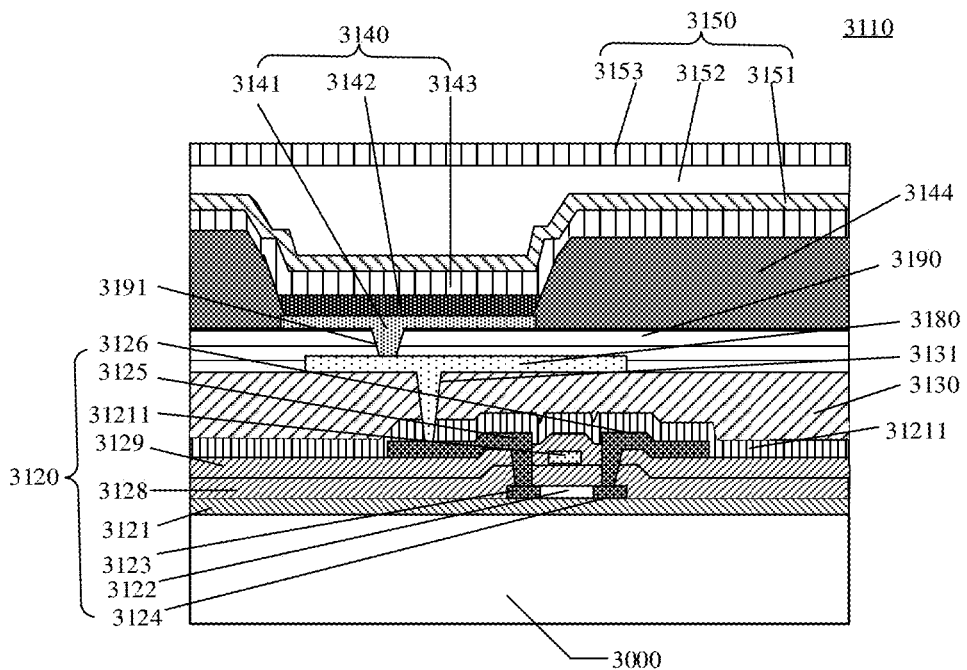
FIG. 7 is a schematic cross-sectional view of a display region of another display substrate provided by another embodiment of the present disclosure.

For example, at least one embodiment of the present disclosure provides another display substrate. FIG. 7 is a schematic cross-sectional view of a display region of another display substrate provided by another embodiment of the present disclosure. As shown in FIG. 7, sub-pixels of the display region of the display substrate 200 may also include a pixel structure 3110 for driving and controlling light emission. The pixel structure 3110 includes a pixel drive circuit 3120, a first planarization layer 3130, a first transfer electrode 3180, a second planarization layer 3190, and a light-emitting element 3140.

For example, the pixel structure 3110 also includes a buffer layer 3121 on the base substrate 3000. The pixel drive circuit 3120 may include an active layer 3122 on the buffer layer 3121, a gate insulation layer 3128 on a side of the active layer 3122 away from the substrate 3000, a gate electrode 31211 on the gate insulation layer 3128, an interlayer insulation layer 3129 located on a side of the gate electrode 31211 away from the base substrate 3000 and on a side of a source electrode and a drain electrode (a source electrode 3125 and a drain electrode 3126 in FIG. 7) close to the base substrate 3000, and a source electrode 3125 and drain electrode 3126 located on the interlayer insulation layer 3129. The gate electrode 31211 may be arranged in the same layer as the plurality of lead wires 2210 in the first bonding region 2300. Therefore, the gate electrode 31211 and the plurality of lead wires 2210 can be formed on the same layer in the manufacturing process, for example, by using the same material layer through the patterning process. The interlayer insulation layer 3129 may be arranged in the same layer as the first insulation layer 2331, so that the interlayer insulation layer 3129 and the first insulation layer 2331 can be formed on the same layer in the manufacturing process, for example, by using the same material layer through the patterning process. The buffer layer 3121 in the display region is arranged on the same layer as the bonding buffer layer 2341, and the buffer layer 3121 and the bonding buffer layer 2341 can be formed on the same layer in the manufacturing process. The gate insulation layer 3128 in the display region is arranged on the same layer as the bonding region gate insulation layer 2342, and the gate insulation layer 3128 and the bonding region gate insulation layer 2342 can be formed on the same layer in the manufacturing process. As a transition layer, the buffer layer 3121 can prevent harmful substances in the base substrate from intruding into the display substrate and increase the adhesion of the film layer in the display substrate 200 to the base substrate 3000.

For example, as shown in FIG. 7, the pixel structure 3110 further includes a passivation layer 31212 on the source electrode 3125 and the drain electrode 3126. The passivation layer 31212 is located between the pixel drive circuit 3120 and the first planarization layer 3130 and includes a passivation layer via hole. The passivation layer 31212 can protect the source electrode and the drain electrode of the pixel drive circuit 3130 from water vapor corrosion. The pixel drive circuit and the first switching electrode 3180 are also electrically connected through the passivation layer via hole.

For example, compared with the structure of the display substrate as shown in FIG. 6, the structure of the display substrate as shown in FIG. 7 is different in that, a fourth insulation layer is added between the interlayer insulation layer and the source electrode and the drain electrode, and the fourth insulation layer is located on a side of the second capacitor electrode 2162 away from the base substrate for providing insulation protection for the second capacitance electrode 2162. In the display substrate in FIG. 7, the passivation layer 31212 is added on the source electrode and the drain electrode to protect the pixel drive circuit.

For example, as shown in FIG. 7, the active layer 3122 may include a source region 3123, a drain region 3124, and a channel region located between the source region 3123 and the drain region 3124. The interlayer insulation layer 3129 and the gate insulation layer 3128 have via holes that is arranged to expose the source region 3123 and the drain region 3124. The source electrode 3125 and the drain electrode 3126 are electrically connected to the source region 3123 and the drain region 3124 through via holes, respectively. The gate electrode 31211 overlaps with the channel region between the source region 3123 and the drain region 3124 in the active layer 3122 in the direction perpendicular to the base substrate 3000. The first planarization layer 3130 is located above the source electrode 3125 and the drain electrode 3126 for planarizing the surface of the pixel drive circuit on the side away from the base substrate. The first planarization layer 3130 can planarize that uneven surface caused by the pixel drive circuit, and thus prevent irregularities caused by the pixel drive circuit from cause defects in the light-emitting device. A first via hole 3131 is formed in the first planarization layer 3130 to expose the source electrode 3125 or the drain electrode 3126 (as shown in the figure), and the first transfer electrode 3180 is formed on the first planarization layer 3130. The first transfer electrode 3180 is electrically connected to the source electrode 3125 through the first via hole 3131, and the transfer electrode 3180 can avoid directly forming a through via with a relatively large aperture in the first planarization layer and a second planarization layer, thereby improving the electrical connection quality of the via hole. At the same time, the first transfer electrode can also be formed on the same layer as other signal lines (such as power lines, etc.), thus not causing an increase in process steps. The source electrode 3125 and the drain electrode 3126 are arranged on the same layer as the first conductive pattern 23111. Therefore, the source electrode 3125, the drain electrode 3126, and the first conductive pattern 23111 can be formed on the same layer in the manufacturing process, for example, by using the same material layer through the patterning process. The first transfer electrode 3180 is arranged on the same layer as the second conductive pattern 23112 of the plurality of contact pads 2310. Therefore, the first transfer electrode 2180 and the second conductive pattern 23112 can be formed on the same layer in the manufacturing process, for example, by using the same material layer through the patterning process, thus simplifying the manufacturing process.

For example, in some examples of the present disclosure, as shown in FIG. 7, the second planarization layer 3190 is arranged on the side of the first transfer electrode 3180 away from the base substrate 3000 to provide a planarization surface on the side of the first transfer electrode 3180 away from the base substrate 3000. In addition, a second via hole 3191 is formed in the second planarization layer 3190. The second planarization layer 3190 is arranged on the same layer as the second insulation layer 2332, so that the second planarization layer 3190 and the second insulation layer 2332 can be formed on the same layer in the manufacturing process, for example, by using the same material layer through manufacturing process, thus simplifying the manufacturing process.

For example, continue as shown in FIG. 7, the light-emitting element 3140 is formed on the second planarization layer, that is, the light-emitting element 3140 is arranged on the side of the second planarization layer 3190 away from the base substrate. The light-emitting element 3140 includes a first electrode 3141, a light-emitting layer 3142, and a second electrode 3143. The first electrode 3141 of the light-emitting element is electrically connected to the source electrode 2125 through the first via hole 3131 in the first planarization layer 3130. A pixel defining layer 3144 is formed on the first electrode 3141, and the pixel defining layer 3144 includes a plurality of openings to define a plurality of pixel units. Each of the plurality of openings exposes the first electrode 3141, and the light-emitting layer 3142 is arranged in the plurality of openings of the pixel defining layer 3144. The second electrode 3143 may be arranged, for example, in a part of or the whole of the display region, so that the second electrode 3143 may be formed on the whole surface in the manufacturing process.

For example, the first electrode 3141 may include a reflective layer, and the second electrode 3143 may include a transparent layer or a translucent layer. Thus, the first electrode 3141 may reflect light emitted from the light-emitting layer 3142, and the part of light is emitted into the external environment through the second electrode 3143, so that light emission rate may be provided. In the case where the second electrode 3143 includes a semi-transmissive layer, some light reflected by the first electrode 3141 is reflected again by the second electrode 3143, so that the first electrode 3141 and the second electrode 3143 form a resonant structure, thereby improving light emission efficiency.

For example, continue as shown in FIG. 7, in at least one example of the present disclosure, the display substrate 200 may further include an encapsulation layer 3150 arranged on the light-emitting element 3140. The encapsulation layer 3150 seals the light-emitting element 3140, so that degradation of the light-emitting element 3140 caused by moisture and/or oxygen included in the environment may be reduced or avoided. The encapsulation layer 3150 may be a single-layer structure or a composite layer structure, and the composite layer structure includes a structure in which inorganic layers and organic layers are stacked. For example, the encapsulation layer 3150 may include a first inorganic encapsulation layer 3151, a first organic encapsulation layer 3152, and a second inorganic encapsulation layer 3153 which are sequentially arranged. The encapsulation layer 3150 may extend to the bonding region, and in the above example, the encapsulation layer does not cover the plurality of contact pads. One layer of the encapsulation layer 3150 is arranged on the same layer as the third insulation layer 2333 in the bonding peripheral region 2500. One layer of the encapsulation layer 3150 and the third insulation layer 2333 can be formed by the same patterning process.

It should be noted that the materials of the same film structure of the display substrate in FIG. 7 and the display substrate in FIG. 6 will not be described in detail.

At least one embodiment of the present disclosure further provides a display device, which may include the display substrate of any one of the above embodiments.

For example, in some examples, the display device may further include a flexible circuit board and a control chip. For example, the flexible circuit board is bonded to the bonding region of the display substrate, and the control chip is installed on the flexible circuit board, thereby electrically connecting with the display region. Alternatively, the control chip is directly bonded to the bonding region, thereby being electrically connected to the display region.

For example, the control chip may be a central processing unit, a digital signal processor, a system chip (SoC), etc. For example, the control chip may also include a memory, a power supply module, etc., and power supply function and signal input and output function are realized through additionally arranged wires, signal lines, etc. For example, the control chip may further include a hardware circuit, computer executable code, etc. The hardware circuit may include conventional very large scale integration (VLSI) circuits or gate arrays, and existing semiconductors such as logic chips, transistors, or other discrete components. The hardware circuit may further include field programmable gate arrays, programmable array logic, programmable logic devices, etc.

For example, the display device provided by at least one embodiment of the present disclosure may be any product or component having a display function, such as a mobile phone, a tablet computer, a television, a display, a notebook computer, a digital photo frame, a navigator, etc.

At least one embodiment of the present disclosure further provides a manufacturing method of a display substrate, which includes: providing a base substrate, the base substrate including a display region, a dam region at least partially surrounding the display region, a transition region on a side of the dam region away from the display region, a first bonding region on a side of the transition region away from the dam region, and a bonding peripheral region located at the side of the transition region away from the dam region, and the bonding peripheral region located between the first bonding region and the transition region; forming lead wires in the first bonding region; forming a plurality of contact pads in the first bonding region, the plurality of contact pads being formed to be electrically connected to one of the lead wires; forming a first insulation laminated layer in the first bonding region; and forming a second insulation laminated layer in the bonding peripheral region, so that at least two insulation layers of the second insulation laminated layer extend into the first bonding region to form the first insulation laminated layer, and a thickness of the first insulation laminated layer along a direction perpendicular to the base substrate is smaller than a thickness of the second insulation laminated layer along the direction perpendicular to the base substrate.

For example, in the display substrate obtained by the manufacturing method provided by the above embodiment, the first insulation laminated layer is formed on the bonding boundary region, and the height of the first insulation laminated layer relative to the base substrate is smaller than the height of the second insulation laminated layer located in the bonding peripheral region relative to the base substrate, so that the height of the film layer difference in the bonding peripheral region is reduced, the risk of bubbles generated in the bonding peripheral region and the bonding boundary region is reduced, which is helpful to complete the bonding process and improve the product yield of the display substrate and reliability of the display substrate.

For example, in the manufacturing method provided by at least one embodiment of the present disclosure, forming the second insulation laminated layer includes: forming a first insulation layer of the second insulation laminated layer on the base substrate, and forming the second insulation layer of the second insulation laminated layer on a side of the first insulation layer away from the base substrate. And the first insulation layer and the second insulation layer extend into the first bonding region to form the first insulation laminated layer.

For example, the manufacturing method provided by at least one embodiment of the present disclosure further includes: forming a pixel structure in the display region, and the pixel structure includes a pixel drive circuit, a first planarization layer, a first transfer electrode, a second planarization layer, and a light-emitting element. Forming the pixel structure in the display region includes: forming the pixel drive circuit on the base substrate, and a thin film transistor being formed in the pixel drive circuit, and a gate electrode, a source electrode, a drain electrode, and an interlayer insulation layer being formed in the thin film transistor, and the interlayer insulation layer being on a side of the gate layer away from the base substrate and on a side of the source electrode and the drain electrode close to the base substrate; forming the first planarization layer on a side of the pixel drive circuit away from the base substrate to provide a first planarization surface, and forming a first via hole in the first planarization layer, forming the first transfer electrode on the first planarization surface, the first transfer electrode being electrically connected to one of the source electrode and the drain electrode through the first via hole, forming the second planarization layer on a side of the first transfer electrode away from the base substrate to provide a second planarization surface, and forming a second via hole in the second planarization surface, and forming the light-emitting element on the second planarization surface, the light-emitting element being electrically connected to the first transfer electrode through the second via hole.

For example, in the manufacturing method provided by at least one embodiment of the present disclosure, forming the second insulation layer includes: depositing a first insulation material layer on the base substrate after forming a second conductive pattern of a conductive pattern lamination layer and the pixel drive circuit; patterning the first insulation material layer, so that a part of the first insulation material layer located in the display region is formed into the second planarization layer, and the second via hole is formed in the second planarization layer; removing a part of the first insulation material layer overlapping with the second conductive pattern, and thinning a part of the first insulation material layer in the first bonding region to form the second insulation layer, so that a height of the second insulation layer relative to the base substrate in the first bonding region is smaller than a height of the second insulation layer relative to the base substrate in the bonding peripheral region, and the second insulation layer covers an edge of the second conductive pattern.

For example, in the manufacturing method provided by at least one embodiment of the present disclosure, patterning the first insulation material layer includes: patterning the first insulation material layer by using a gray tone mask plate patterning process or a halftone mask plate patterning process.

For example, in the manufacturing method provided by at least one embodiment of the present disclosure, forming the second insulation layer includes: after forming the second conductive pattern of the conductive pattern lamination layer and the pixel drive circuit, depositing a first insulation material layer on the base substrate, the first insulation material layer including a photosensitive resin; exposing the first insulation material layer by using a gray tone mask or a halftone mask, developing the exposed photoresist, so that a part of the first insulation material layer located in the display region is formed into the second planarization layer, and the second via hole is formed in the second planarization layer; removing a part of the first insulation material layer overlapping with the second conductive pattern; and thinning a part of the first insulation material layer in the first bonding region to form the second insulation layer, so that a height of the second insulation layer relative to the base substrate in the first bonding region is smaller than a height of the second insulation layer relative to the base substrate in the bonding peripheral region, and the second insulation layer covers an edge of the second conductive pattern.

Next, taking the display substrate as shown in FIG. 3 as an example, the manufacturing method of the display substrate in the embodiments of the present disclosure will be described in detail with reference to FIG. 8A to FIG. 8K.

For example, sub-pixels of the display region of the display substrate may also include a pixel structure 1110. The pixel structure 1110 includes a pixel drive circuit 1120, a first planarization layer 1130, a first transfer electrode 1180, a second planarization layer 1190, and a light-emitting element 1140.

For example, providing a base substrate 1000. The base substrate 1000 includes a display region, a first bonding region on a side of the display region, a bonding boundary region, and a bonding peripheral region. For example, a buffer layer 1121 is formed in the display region of the base substrate 1000 by a deposition process, while the bonding region buffer layer 1341 is formed in the first bonding region.

For example, the material of the base substrate 1000 may include an organic material, for example, the organic material may be a resin material, such as polyimide, polycarbonate, polyacrylate, polyetherimide, polyethersulfone, polyethylene terephthalate, and polyethylene naphthalate, etc., and the base substrate 1000 may be a flexible substrate or a non-flexible substrate, and the embodiments of the present disclosure are not limited thereto.

For example, the materials of the buffer layer 1121 and the bonding region buffer layer 1341 may include insulation materials, such as silicon oxide, silicon nitride, and silicon oxynitride, etc.

For example, forming an active layer 1122 on the buffer layer 1121. For example, a semiconductor material layer is deposited on the base substrate 1000, and then a patterning process is performed on the semiconductor material layer to form the active layer 1122. The active layer 1121 includes a source region 1123, a drain region 1124, and a channel region between the source region 1123 and the drain region 1124.

For example, the material of the active layer 1122 may include polysilicon or an oxide semiconductor (for example, indium gallium zinc oxide).

For example, after forming the active layer 1122, a gate insulation layer 1128 is formed on the active layer 1212 by a deposition method, and a bonding region gate insulation layer 1342 is formed on the bonding region buffer layer 1341 in the first bonding region. For example, materials of the gate insulation layer 1128 and the bonding region gate insulation layer 1342 may include insulation materials, such as silicon oxide, silicon nitride, and silicon oxynitride.

For example, after forming the gate insulation layer 1128, the gate electrode 11211 and the first capacitor electrode 1161 are formed on the gate insulation layer 1128 in the display region by a patterning process, and a plurality of lead wires 1210 are formed on the base substrate 1000 in the first bonding region. Materials of the gate electrode and the first capacitor electrode may include a metal material or an alloy material, such as a metal single-layer or a multi-layer structure formed by molybdenum, aluminum, titanium, etc., for example, the multi-layer structure is a multi-metal laminated layer (such as a three-layer metal laminated layer of titanium, aluminum, and titanium (Ti/Al/Ti).

In some examples, the gate electrode may be used as a mask, and the source region 1123 and drain region 1124, which are conductive, are formed by doping the active layer, while the channel region between the source region 1123 and the drain region 1124 is undoped due to the shielding effect of the gate electrode.

For example, after forming the gate electrode 11211, the first capacitor electrode 1161, and the plurality of lead wires 1210, an insulation material is deposited on the base substrate by a deposition process or the like, an interlayer insulation layer 1129 is formed on the gate electrode 11211, and a first insulation layer 1331 is formed on the plurality of lead wires 1210, the bonding peripheral region 1500, and the bonding boundary region 1400 in the first bonding region by a patterning process. A first conductive pattern via hole 13114 is formed in the first insulation layer 1331. For example, materials of the interlayer insulation layer and the first insulation layer may include insulation materials, such as silicon oxide, silicon nitride, and silicon oxynitride.

For example, then, a metal material layer is deposited on the base substrate of the display region, and a second capacitor electrode 1162 is formed at a portion overlapping with the first capacitor electrode 1161 by a patterning process. The first capacitor electrode 1161 and the second capacitor electrode 1162 are implemented as a storage capacitor 1160.

For example, after forming the second capacitor electrode 1162, a fourth insulation layer 11210 is formed in the display region by a deposition process, and the material of the fourth insulation layer 11210 may include insulation materials, such as silicon oxide, silicon nitride, and silicon oxynitride.

For example, via holes are formed in the gate insulation layer 1128, the interlayer insulation layer 1129, and the fourth insulation layer 11210 to expose the source region 2123 and the drain region 2124 of the active layer 2122.

For example, then, a source electrode 1125 and a drain electrode 1126 are formed in the display region by a patterning process, and a first conductive pattern 13111 is formed in the first bonding region. The first conductive pattern 13111 is electrically connected to the plurality of lead wires 1210 through the first conductive via hole 13114 in the first insulation layer 1331.

For example, an insulation material is deposited in the display region, a first planarization layer 1130 is formed by a patterning process, and a first via hole 1131 is formed in the first planarization layer 1130.

Figure 8A:
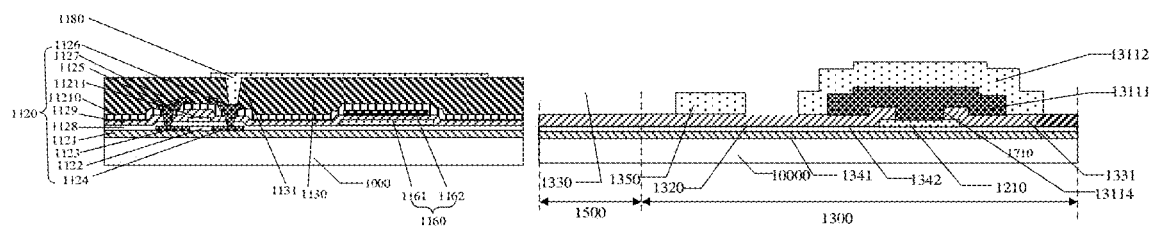
FIG. 8A to FIG. 8K are process diagrams of a manufacturing method of a display substrate provided by some embodiments of the present disclosure.

For example, as shown in FIG. 8A, after forming the pixel drive circuit 1120, the storage capacitor 1160, the first planarization layer 1130, the plurality lead wires 1210 in the first bonding region, the first insulation layer 1331 in the first bonding region, and the first conductive pattern 13111 in the first bonding region on the display substrate, a metal material layer is deposited on the base substrate. The metal material layer is patterned to form a first transfer electrode 1180 in the display region, the second conductive pattern 13112 in the first bonding region, and the marking metal layer 1350 in the bonding boundary region. The second conductive pattern 13112 covers edges of the first conductive pattern 13111 to prevent the first conductive pattern 13111 from being corroded. The materials of the first transfer electrode, the second conductive pattern, and the marking metal layer may include a metal material or an alloy material, such as a metal single-layer structure or a metal multi-layer structure formed by molybdenum, aluminum, titanium, etc.

In some implementations of the present disclosure, the marking metal layer 1350 may also be formed on the same layer as the first conductive pattern layer 13111, and embodiments of the present disclosure are not limited thereto.

Figure 8B:
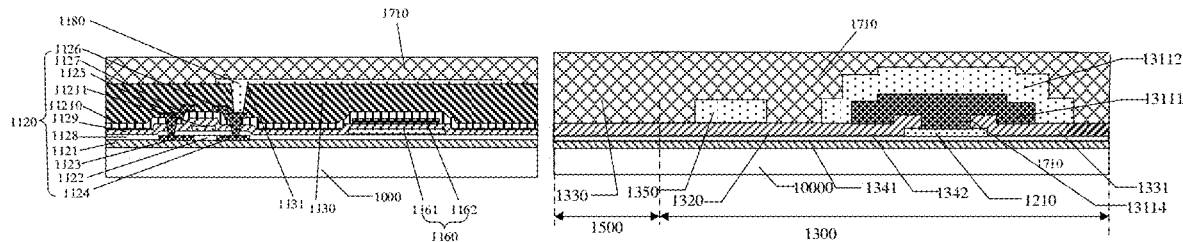

For example, as shown in FIG. 8B, depositing a first insulation material layer 1710 on the base substrate. The first insulation material layer 1710 may include insulation materials, such as silicon oxide, silicon nitride, and silicon oxynitride.

Figure 8C:
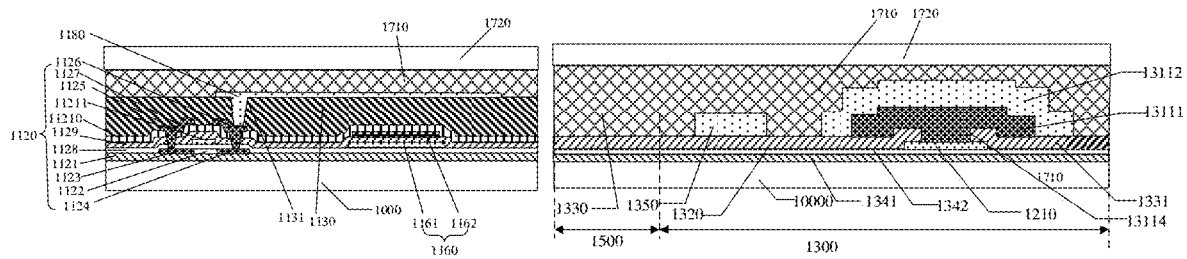

For example, as shown in FIG. 8C, a photoresist 1720 is deposited on the first insulation material layer 1710.

Figure 8D:
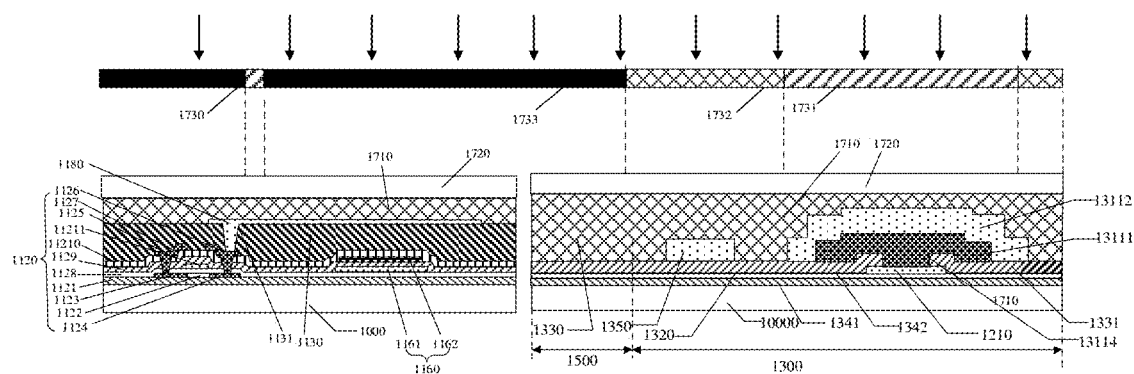

For example, as shown in FIG. 8D, a first mask 1730 is provided to expose the photoresist 1720, and the first mask 1730 includes a completely non-transparent region, a partially transparent region, and an opaque region. The first mask 1730 includes a second transparent pattern 1732 overlapping the gaps between the plurality of contact pads 1310 in the first bonding region 1300, a first transparent pattern 1731 overlapping the plurality of contact pads 1310, a second transparent pattern 1732 in the bonding boundary region 1400, and a non-transparent pattern 1733 in the bonding peripheral region 1500. The first mask 1730 includes a first transparent pattern 1731 and a non-transparent pattern 1733 in the display region. The first transparent pattern 1731 is located in the completely transparent region, the second transparent pattern 1732 is located in the partially transparent region, and the non-transparent pattern 1733 is located in the non-transparent region. That is, the second mask 1730 is a gray mask or a halftone mask. The photoresist is a positive photoresist, and correspondingly, the light transmittance of the second light transparent pattern 1732 is less than the light transmittance of the first light transparent pattern 1731. In the exposure process, in the case where the part of the photoresist 1720 corresponding to the first light transparent pattern 1731 is completely exposed, the part of the photoresist 1720 corresponding to the second light transparent pattern 1732 may be partially exposed. The part of the photoresist 1720 corresponding to the non-transparent pattern 1733 is not exposed.

Figure 8E:
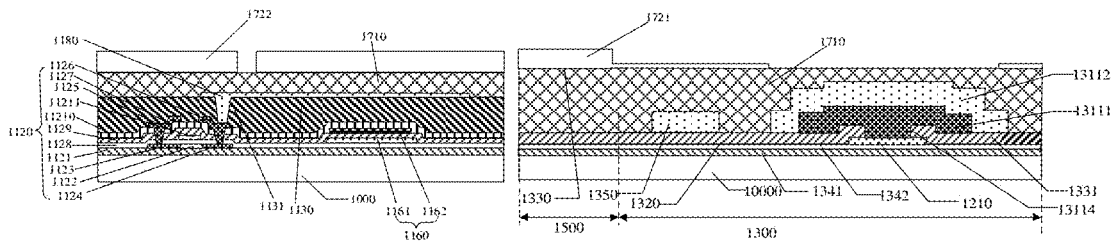

For example, as shown in FIG. 8E, the photoresist 1720 is developed, so that the part of the photoresist 1720 that is completely exposed, is removed, that is, in the display peripheral region, the photoresist 1720 overlapped with the plurality of contact pads 1310 is removed, the part of the photoresist 1720 that is is partially exposed, is thinned, and the thickness of the part of the photoresist 1720 that is not exposed, is, for example, basically unchanged. After developing, the photoresist 1720 is formed into a photoresist pattern 1721 in the first bonding region. Similarly, in the display region, the photoresist 1720 that is completely exposed, is removed. After developing, the photoresist 1720 is formed into a photoresist pattern 1722 in the display region.

For example, in the above patterning process, a negative photoresist may also be used, and then the mask plate used is, for example, a mask plate complementary to the first mask plate 1730, so that the photoresist pattern 1721 and the photoresist pattern 1722 are obtained after exposing and developing.

Figure 8F:
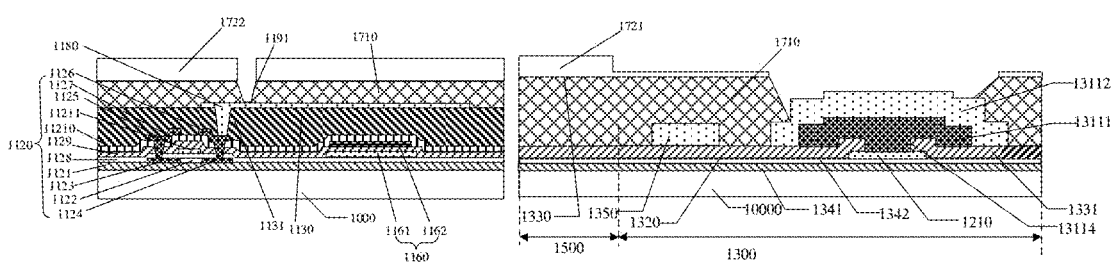

For example, as shown in FIG. 8F, the first insulation material layer 1710 is etched in the display peripheral region and the display region to remove the insulation material layer overlapping the plurality of contact pads in the first bonding region, and a second via hole 1191 is formed in the display region to expose the first transfer electrode 1180.

Figure 8G:
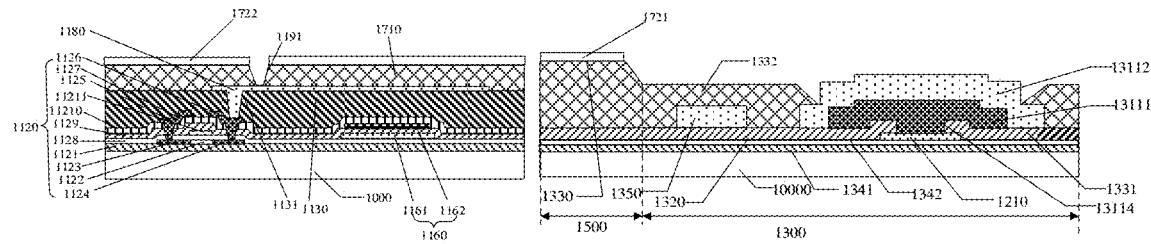

For example, as shown in FIG. 8G, after that, an ashing process is performed to remove the photoresist that is partially exposed in the display peripheral region, and to form a photoresist pattern 1721 and a photoresist pattern 1722 for thinning the display region. Then, the current photoresist patterns is used, the remaining first insulation material layer 1710 in the first bonding region is etched and the etching thickness is controlled to form a second insulation layer 1332. The second insulation layer 1332 covers edges of the second conductive pattern 13112. And the height of the first insulation layer 1332 in the bonding boundary region 1400 relative to the surface of the base substrate 1000 is smaller than the height of the first insulation layer 1332 in the bonding peripheral region 1500 relative to the surface of the base substrate 1000. For example, in the bonding boundary region 1400 and the bonding peripheral region 1500, the second insulation layer 1332 has a slope angle with respect to the base substrate, which is about 40 degrees to 60 degrees, and for example, is about 50 degrees.

Figure 8H:
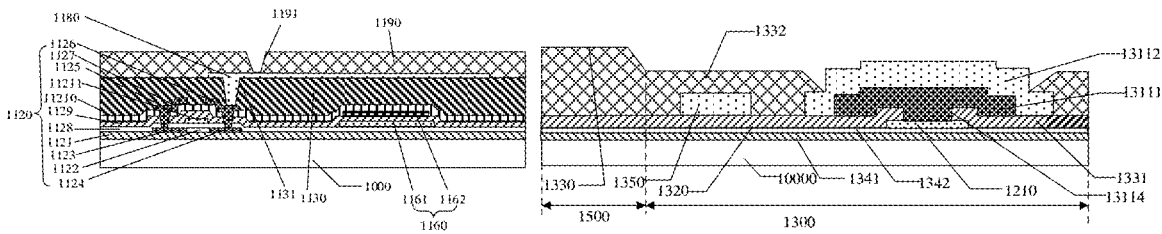

For example, as shown in FIG. 8H, the photoresist pattern 1722 in the display region and the photoresist pattern 1721 in the display peripheral region are removed. A second planarization layer 1190 is formed in the display region to provide a planarization surface.

Figure 8I:
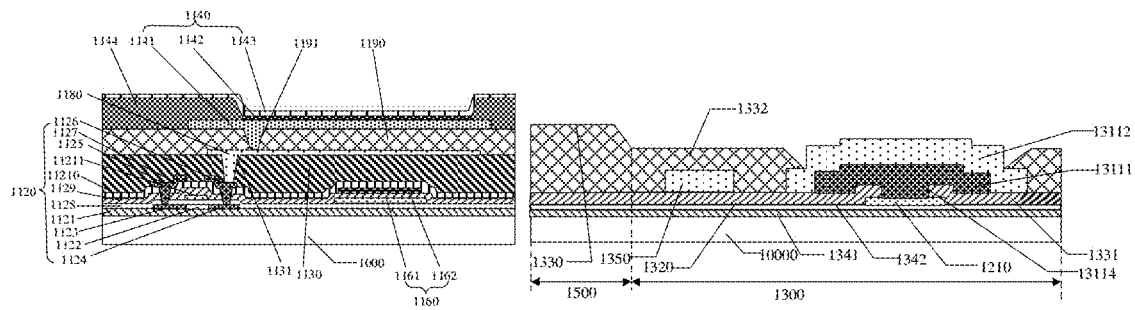

For example, as shown in FIG. 8I, the first electrode 1141 of the light-emitting element 1140 is formed on the second planarization 1190 of the display region, a pixel defining layer 1144 is formed on the second planarization 1190 and the first electrode 1141. The pixel defining layer 1144 includes a plurality of openings to define a plurality of pixel units. Each of the plurality of openings exposes the corresponding first electrode 1141. Thereafter, the light-emitting layer 1142 is formed in the plurality of openings of the pixel defining layer 1144 by, for example, an evaporation process, and then the second electrode 1143 is formed on the pixel defining layer 1144 and the light-emitting layer 1142, for example, the second electrode 1143 may be formed in a part of or the whole of the display region, so that the second electrode 1143 may be formed on the whole surface in the manufacturing process. The first electrode 1141 of the light-emitting element 1140 is electrically connected to the first transfer electrode 1180 through the second via hole 1191.

For example, the material of the first electrode 1141 may include at least one transparent conductive oxide material, which includes indium tin oxide (ITO), indium zinc oxide (IZO), zinc oxide (ZnO), etc. In addition, the first electrode 1141 may adopt a metal having high reflectivity as a reflective layer, such as silver (Ag).

For example, for OLED, the light-emitting layer 1142 may adopt a small molecular organic material or a polymer molecular organic material, which may be a fluorescent light-emitting material or a phosphorescent light-emitting material, and may emit red light, green light, blue light, or white light. In addition, the light-emitting layer may further include functional layers, such as an electron injection layer, an electron transport layer, a hole injection layer, a hole transport layer, and the like as required. For QLED, the light-emitting layer may adopt a quantum dot material, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc., and the particle size of the quantum dots ranges from 2 to 20 nm.

For example, the second electrode 1143 may adopt various conductive materials. For example, the second electrode 1143 may adopt a metal material, such as lithium (Li), aluminum (Al), magnesium (Mg), silver (Ag), etc.

For example, the material of the pixel defining layer 1144 may include organic insulation materials, such as polyimide, polyphthalimide, polyphthalamide, acrylic resin, benzocyclobutene or phenolic resin, etc., or inorganic insulation materials, such as silicon oxide, silicon nitride, etc., and the embodiments of the present disclosure are not limited thereto.

Figure 8J:
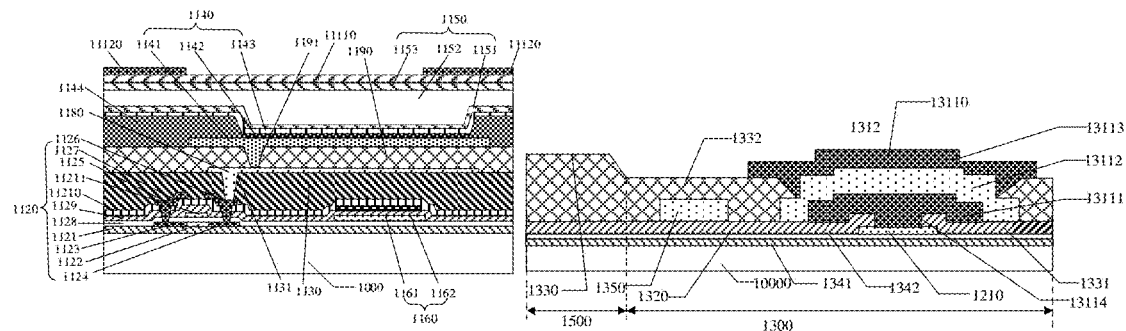

For example, as shown in FIG. 8J, depositing an insulation material on the light-emitting element 1140 in the display region, and forming a fifth insulation layer 11110 in the display region by a patterning process. The fifth insulation layer 11110 may provide a planarization surface. The material of the fifth insulation layer 11110 may include organic insulation materials such as polyimide, phthalimide, phthalamide, acrylic resin, benzocyclobutene or phenolic resin, etc., or inorganic insulation materials such as silicon oxide and silicon nitride, which are not limited by the embodiments of the present disclosure.

For example, a metal material layer is deposited on the fifth insulation layer 11110, and an auxiliary electrode 11120 is formed in the display region by a patterning process. A third conductive pattern 13113 is formed in the first bonding region, and the third conductive pattern 13113 covers edges of the second insulation layer 1332. The metal material layer may include indium tin oxide (ITO), and thus obtaining a transparent electrode may, or the material forming an auxiliary electrode 11120 may include a metal mesh, and thus may obtaining a transparent electrode. For example, the auxiliary electrode 11120 may be used as a touch electrode in other embodiments.

Figure 8K:
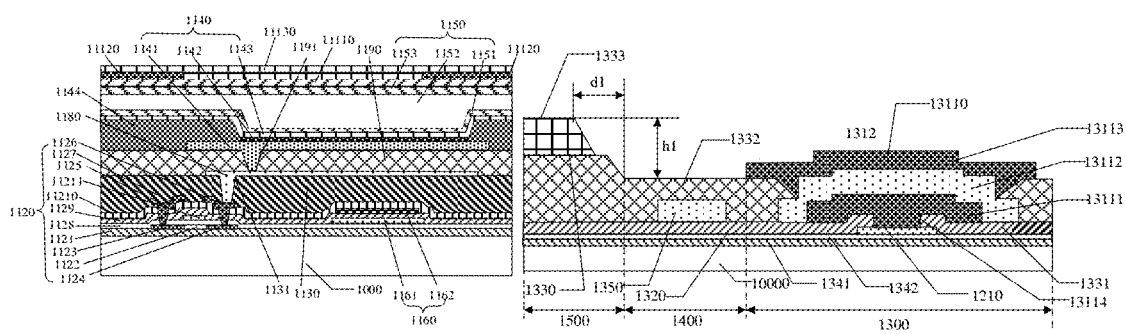

For example, as shown in FIG. 8K, an insulation material is deposited on the base substrate, and a display region protective layer 11130 is formed in the display region and a third insulation layer 1333 is formed in the bonding peripheral region by a patterning process. The third insulation layer 2333 plays a sealing role for the first bonding region to avoid the internal structure of the first bonding region from being corroded and damaged. The material of the third insulation layer may include organic insulation materials. The organic insulation materials can be polymer materials containing desiccant or polymer materials that can block water vapor, such as polymer resin, etc.

In another example of the present disclosure, the manufacturing method of the display substrate as shown in FIG. 3 may include FIG. 8C-FIG. 8H, and the processes as shown in FIG. 8C-FIG. 8H may refer to the related descriptions of the above examples.

For example, in this example, the first insulation material layer 1710 may be a photosensitive resin material, such as photoresist. For example, the photosensitive resin material is a positive photoresist, and after coating the photosensitive resin material to form a first insulation material layer, an exposure process is performed by using, for example, the first mask plate 1730, which includes a completely transparent region, a partially transparent region, and a transparent region. The first mask 1730 includes a first transparent pattern 1731 and a non-transparent pattern 1733 in the display region. The first transparent pattern 1731 is located in the completely transparent region, the second transparent pattern 1732 is located in the partially transparent region, and the non-transparent pattern 1733 is located in a non-transparent region. That is, the second mask 1730 is a gray mask or a halftone mask. The photoresist is a positive photoresist, and correspondingly, the light transmittance of the second light transparent pattern 1732 is less than the light transmittance of the first light transparent pattern 1731.

In the exposure process, the part of the first insulation material layer 1710 corresponding to the first transparent pattern 1731 is completely exposed, the part corresponding to the second transparent pattern 1732 is partially exposed, and the part corresponding to the non-transparent pattern 1733 of the display region is not exposed. After developing, the first insulation material layer 1710 that is not exposed in the display region forms a second planarization layer 1190. A second insulation layer 1332 is formed on the first insulation material layer 1710 that is partially exposed in the first bonding region. The second insulation layer 1332 covers edges of the second conductive pattern 13112. And the height of the first insulation layer 1332 in the bonding boundary region 1400 relative to the surface of the base substrate 1000 is smaller than the height of the first insulation layer 1332 in the bonding peripheral region 1500 relative to the surface of the base substrate 1000. Accordingly, the first insulation material layer 1710 that is completely exposed in the display region and the first bonding region, is removed to form the second via hole 1191 in the display region and to expose the plurality of contact pads in the first bonding region. The above manufacturing method can also obtain the display substrate of the embodiments as shown in FIG. 8H.

For another example, the photosensitive resin material can also be an negative photoresist, and the mask plate used in this case is, for example, a mask plate complementary to the above-mentioned first mask plate 1730, so that a second planarization layer and a first insulation layer are also formed in the display region after the exposure process and the developing process, and the first insulation layer is formed to expose the plurality of contact pads and cover the edges of the plurality of contact pads.

In the display substrate obtained by the manufacturing method provided by the above embodiment, the first insulation laminated layer is formed on the bonding boundary region of the display peripheral region, and the height of the first insulation laminated layer relative to the base substrate is smaller than the height of the second insulation laminated layer located in the bonding peripheral region relative to the base substrate, so that the height of the film layer difference in the bonding peripheral region is reduced, the risk of bubbles generated in the bonding peripheral region and the bonding boundary region is reduced, which is helpful to complete the bonding process and improve the product yield of the display substrate and reliability of the display substrate.

For another example, in another embodiment, a manufacturing method corresponding to the display substrate as shown in FIG. 7 is provided. Compared the display substrate as shown in FIG. 7 with the structure of the display substrate as shown in FIG. 6, the structure of the display substrate as shown in FIG. 7 adds a passivation layer 31212 on the source electrode and the drain electrode to protect the pixel drive circuit.

In this embodiment, the step of forming the passivation layer may be added after forming the source electrode and the drain electrode of the pixel drive circuit and before forming the first planarization layer. For example, the passivation layer film is formed to cover the source electrode 3125 and the drain electrode 3126, and then the passivation layer film is patterned to form a passivation layer via hole which is configured to expose the drain electrode 3125 in the display region.

For example, the material of the passivation layer may include an organic insulation material or an inorganic insulation material, such as silicon nitride material, which can well protect the pixel drive circuit from being corroded by the water vapor due to its high dielectric constant and good hydrophobic function.

It should be noted that, in various embodiments of the present disclosure, the flow of the manufacturing method of the display device may include more or less operations, and these operations may be performed sequentially or in parallel. Although the flow of the manufacturing method described above includes a plurality of operations occurring in a specific order, it should be clearly understood that the order of the plurality of operations is not limited. The manufacturing method described above may be performed at one time or multiple times according to a predetermined condition.

Regarding the technical effect of the manufacturing method of the display device provided in the above embodiments, reference can be made to the technical effect of the display device provided in the embodiments of the present disclosure, which will not be repeated here.

The following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiments can be combined with each other to obtain new embodiments.

The above are merely specific implementations of the present disclosure without limiting the protection scope of the present disclosure thereto. The protection scope of the present disclosure should be based on the protection scope of the appended claims.

What is claimed is:

1. A display substrate, comprising:
   a base substrate, comprising a display region, a dam region at least partially surrounding the display region, a transition region on a side of the dam region away from the display region, a first bonding region on a side of the transition region away from the dam region, and a bonding peripheral region on the side of the transition region away from the dam region, wherein the bonding peripheral region is between the first bonding region and the transition region;
   lead wires, in the first bonding region;
   a plurality of contact pads, in the first bonding region and configured to be electrically connected to the lead wires, respectively;
   a first insulation laminated layer, in the first bonding region;
   a second insulation laminated layer, in the bonding peripheral region, wherein at least two insulation layers of the second insulation laminated layer extend into the first bonding region to obtain the first insulation laminated layer; and
   a third insulation laminated layer, in the transition region, wherein the third insulation laminated layer comprises a first insulation laminated sub-layer and a second insulation laminated sub-layer, an orthographic projection of the first insulation laminated sub-layer on the base substrate at least partially covers the transition region and the bonding peripheral region, and an orthographic projection of the second insulation laminated sub-layer on the base substrate at least partially covers the transition region and the bonding peripheral region, wherein a thickness of the first insulation laminated layer along a direction perpendicular to the base substrate is smaller than a thickness of the second insulation laminated layer along the direction perpendicular to the base substrate, the third insulation laminated layer further comprises a third insulation laminated sub-layer that is between the first insulation laminated sub-layer and the second insulation laminated sub-layer, and an orthographic projection of the third insulation laminated sub-layer on the base substrate does not overlap with the first bonding region and the bonding peripheral region.

2. The display substrate according to claim 1, wherein the plurality of contact pads comprise a plurality of first contact pads and a plurality of second contact pads, the plurality of first contact pads are arranged in at least one row, and each of the plurality of first contact pads and each of the plurality of second contact pads comprise a conductive pattern lamination layer.

3. The display substrate according to claim 1, wherein the at least two insulation layers comprise a first insulation layer and a second insulation layer, and the first insulation layer is on the base substrate and the second insulation layer is on a side of the first insulation layer away from the base substrate, and the first insulation laminated sub-layer extends to the bonding peripheral region to obtain the first insulation layer, and the second insulation laminated sub-layer extends to the bonding peripheral region to obtain the second insulation layer.

4. The display substrate according to claim 3, further comprising a pixel structure in the display region, wherein the pixel structure comprises a pixel drive circuit, a first planarization layer, a first transfer electrode, a second planarization layer, and a light-emitting element;

the pixel drive circuit comprises a thin film transistor, the thin film transistor comprises a gate electrode, a source electrode, a drain electrode, and an interlayer insulation layer, and the interlayer insulation layer is on a side of the gate electrode away from the base substrate and on a side of the source electrode and the drain electrode close to the base substrate;

the first planarization layer is on a side of the pixel drive circuit away from the base substrate to provide a first planarization surface and comprises a first via hole;

the first transfer electrode is on the first planarization surface and is electrically connected to one of the source electrode and the drain electrode of the thin film transistor through the first via hole;

the second planarization layer is on a side of the first transfer electrode away from the base substrate to provide a second planarization surface and comprises a second via hole; and the light-emitting element is on the second planarization surface and is electrically connected to the first transfer electrode through the second via hole, the interlayer insulation layer is provided at a same layer as the first insulation layer, the second planarization layer is provided at a same layer as the second insulation layer, and the first planarization layer is provided at a same layer as the third insulation laminated sub-layer.

5. The display substrate according to claim 4, wherein a thickness of the second planarization layer along the direction perpendicular to the base substrate is substantially equal to a thickness of the third insulation laminated sub-layer in the transition region along the direction perpendicular to the base substrate and a thickness of the second insulation layer in the bonding peripheral region along the direction perpendicular to the base substrate, respectively.

6. The display substrate according to claim 3, wherein relative to the base substrate, a height of the second insulation layer in the first bonding region is smaller than a height of the second insulation layer in the bonding peripheral region.

7. The display substrate according to claim 6, wherein a thickness of the second insulation layer in the bonding peripheral region along the direction perpendicular to the base substrate is substantially equal to a thickness of the second insulation laminated sub-layer in the transition region along the direction perpendicular to the base substrate.

8. The display substrate according to claim 3, wherein the first insulation layer and the second insulation layer extend into the first bonding region to obtain the first insulation laminated layer, the at least two insulation layers further comprise a third insulation layer, and the third insulation layer is on a side of the second insulation layer away from the base substrate and is configured to expose the second insulation layer on a side close to the plurality of contact pads.

9. The display substrate according to claim 8, wherein the display region comprises signal lines configured to be electrically connected to the lead wires, the conductive pattern lamination layer comprises at least two conductive patterns, at least one insulation layer of the first insulation laminated layer covers an edge of one of the at least two conductive patterns and an edge of the at least one insulation layer is covered by the other of the at least two conductive patterns.

10. The display substrate according to claim 9, wherein the conductive pattern lamination layer comprises a first conductive pattern and a second conductive pattern, the first conductive pattern is on a side of the lead wires away from the base substrate and is electrically connected to the lead wires, the second conductive pattern is on a side of the first conductive pattern away from the base substrate and covers an edge of the first conductive pattern, and the second insulation layer of the first insulation laminated layer covers an edge of the second conductive pattern.

11. The display substrate according to claim 9, wherein the first insulation layer of the first insulation laminated layer is between the first conductive pattern and the lead wires, the first insulation layer between the first conductive pattern and the lead wires has first conductive pattern via holes, and the first conductive pattern is electrically connected to the lead wires through the first conductive pattern via holes.

12. The display substrate according to claim 9, wherein the pixel structure further comprises a first display region metal layer, the first conductive pattern is provided at a same layer as the first display region metal layer, the second conductive pattern is provided at a same layer as the first transfer electrode, and the source electrode and the drain electrode of the thin film transistor are in the first display region metal layer.

13. The display substrate according to claim 11, wherein the base substrate further comprises a second bonding region, the second bonding region is on a side of the first bonding region away from the display region, and the first insulation layer extends to the second bonding region;

the display substrate further comprises a plurality of third contact pads and second bonding region lead wires, the plurality of third contact pads are in the second bonding region and on a side of the first insulation layer away from the base substrate, and the plurality of third contact pads comprise a plurality of contact pad metal layers; and the second bonding region lead wires are between the first bonding region and the second bonding region and is configured to connect the plurality of second contact pads and the plurality of third contact pads.

14. The display substrate according to claim 13, wherein the plurality of contact pad metal layers comprise a first contact pad metal layer and a second contact pad metal layer, the first contact pad metal layer is on a side of the first insulation layer away from the base substrate, and the second contact pad metal layer is laminated with the first contact pad metal layer and covers a periphery of the second contact pad metal layer;

the first contact pad metal layer is at a same layer as the first conductive pattern layer; and the second contact pad metal layer is at a same layer as the second conductive pattern layer.

15. The display substrate according to claim 14, wherein the second contact pad metal layer extends toward the first bonding region to form the second bonding region lead wires, and the second insulation layer extends to the second bonding region and covers the second bonding region lead wires and an edge of the second contact pad metal layer.

16. The display substrate according to claim 15, wherein a thickness of a part of the second insulation layer located between the first bonding region and the second bonding region along the direction perpendicular to the base substrate is substantially identical to a thickness of a part of the second insulation layer in the first bonding region along the direction perpendicular to the base substrate, and an orthographic projection of the part of the second insulation layer between the first bonding region and the second bonding region on the base substrate at least partially overlaps with an orthographic projection of the second bonding region lead wires on the base substrate.

17. The display substrate according to claim 11, wherein the conductive pattern lamination layer further comprises a third conductive pattern, and the third conductive pattern is on a side of the second conductive pattern away from the base substrate, and an edge of the second insulation layer of the first insulation laminated layer is covered by the third conductive pattern.

18. The display substrate according to claim 17, wherein the plurality of contact pad metal layers further comprise a third contact pad metal layer, the third contact pad metal layer is on a side of the second contact pad metal layer away from the base substrate and covers an edge of the second insulation layer in the second bonding region, and the third contact pad metal layer is provided at a same layer as the third conductive pattern layer.

* * * * *